(12) United States Patent
Chiu et al.

(10) Patent No.: US 12,707,905 B2
(45) Date of Patent: Aug. 11, 2026

(54) METHOD OF MANUFACTURING SEMICONDUCTOR DEVICES INCLUDING A CAP INSULATING LAYER

(71) Applicant: TAIWAN SEMICONDUCTOR MANUFACTURING COMPANY, LTD., Hsinchu (TW)

(72) Inventors: Shih-Hang Chiu, Taichung City (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 483 days.

(21) Appl. No.: 17/746,323

(22) Filed: May 17, 2022

(65) Prior Publication Data

US 2023/0223253 A1 Jul. 13, 2023

Related U.S. Application Data

(60) Provisional application No. 63/299,205, filed on Jan. 13, 2022.

(51) Int. Cl.

| | |
|---|---|
| ***H10P 14/20*** | (2026.01) |
| ***H10D 30/01*** | (2025.01) |
| ***H10D 64/01*** | (2025.01) |
| ***H10D 64/27*** | (2025.01) |
| ***H10P 14/40*** | (2026.01) |

(Continued)

(52) U.S. Cl.

CPC ....... *H10P 14/2923* (2026.01); *H10D 30/024* (2025.01); *H10D 64/01324* (2026.01); *H10D 64/017* (2025.01); *H10D 64/518* (2025.01); *H10P 14/40* (2026.01); *H10P 14/69394* (2026.01); *H10W 20/033* (2026.01); *H10W 20/054* (2026.01); *B82Y 10/00* (2013.01); *H10D 64/015* (2025.01); *H10P 14/432* (2026.01)

(58) Field of Classification Search

CPC ......... H01L 21/02186; H01L 21/02425; H01L 21/02697; H01L 21/76843; H01L 29/66545

See application file for complete search history.

(56) References Cited

U.S. PATENT DOCUMENTS

| | | | | |
|---|---|---|---|---|
| 9,722,038 | B2 * | 8/2017 | Adusumilli | H01L 21/76877 |
| 10,522,468 | B2 | 12/2019 | Ho et al. | |

(Continued)

FOREIGN PATENT DOCUMENTS

| | | | |
|---|---|---|---|
| CN | 105321883 | A | 2/2016 |
| KR | 102087183 | B1 | 3/2020 |

(Continued)

*Primary Examiner* — Norman D Richards

(74) *Attorney, Agent, or Firm* — STUDEBAKER BRACKETT PLLC

(57) ABSTRACT

In method of manufacturing a semiconductor device, an opening is formed over a first conductive layer in a dielectric layer, a second conductive layer is formed over the first conductive layer in the opening without forming the second conductive layer on at least an upper surface of the dielectric layer, a third conductive layer is formed over the second conductive layer in the opening without forming the third conductive layer on at least an upper surface of the dielectric layer, and an upper layer is formed over the third conductive layer in the opening.

20 Claims, 21 Drawing Sheets

(51) Int. Cl.

| | |
|---|---|
| ***H10P 14/692*** | (2026.01) |
| ***H10W 20/00*** | (2026.01) |
| *B82Y 10/00* | (2011.01) |
| *H10P 14/43* | (2026.01) |

(56) References Cited

U.S. PATENT DOCUMENTS

| | | | |
|---|---|---|---|
| 11,257,755 | B2 | 2/2022 | Chen et al. |
| 11,282,934 | B2 | 3/2022 | Hsiao et al. |
| 11,469,139 | B2 | 10/2022 | Chen et al. |
| 11,984,324 | B2 | 5/2024 | Wei et al. |
| 2012/0064715 | A1 | 3/2012 | Lin et al. |
| 2013/0084699 | A1 | 4/2013 | Morgan et al. |
| 2015/0056796 | A1 | 2/2015 | Kamineni et al. |
| 2015/0357426 | A1 | 12/2015 | Kim et al. |
| 2018/0130707 | A1 | 5/2018 | Clendenning et al. |
| 2019/0035734 | A1 | 1/2019 | Ho et al. |
| 2020/0043796 | A1* | 2/2020 | Yeong ............... H01L 21/76897 |
| 2020/0119018 | A1 | 4/2020 | Chang et al. |
| 2021/0202327 | A1 | 7/2021 | Wang et al. |
| 2021/0343851 | A1* | 11/2021 | Wang ................ H01L 21/28088 |
| 2021/0384036 | A1 | 12/2021 | Fisher et al. |

FOREIGN PATENT DOCUMENTS

| | | | |
|---|---|---|---|
| KR | 10-2021-0013519 | A | 2/2021 |
| KR | 10-2021-0155732 | A | 12/2021 |
| KR | 10-2022-0002072 | A | 1/2022 |
| TW | 201911435 | A | 3/2019 |
| TW | 202114066 | A | 4/2021 |
| TW | 202201491 | A | 1/2022 |

* cited by examiner

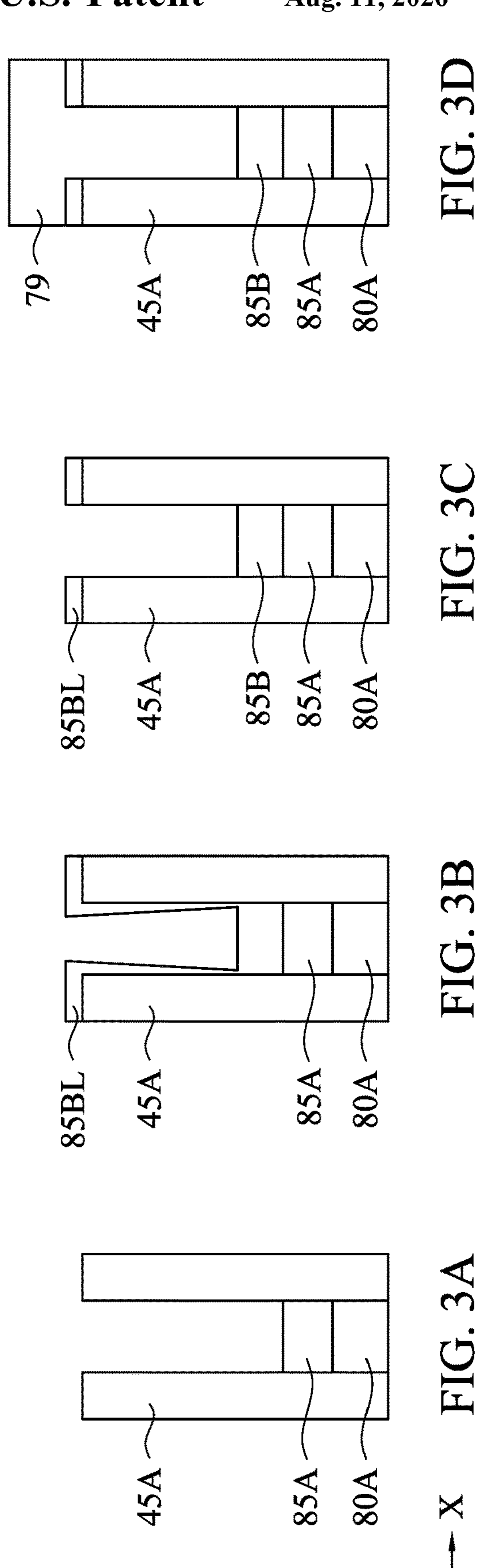
FIG. 3D
FIG. 3C
FIG. 3B
FIG. 3A
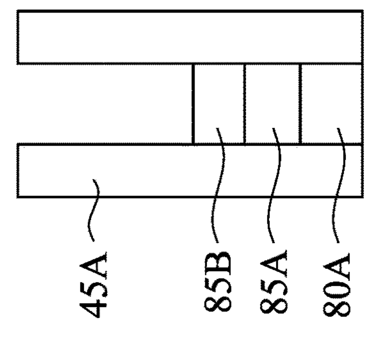
FIG. 3G
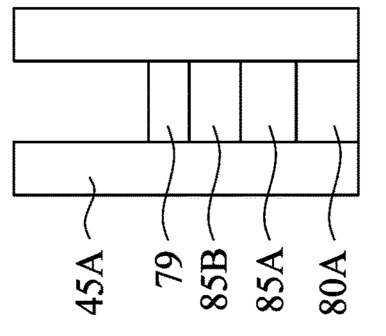
FIG. 3F
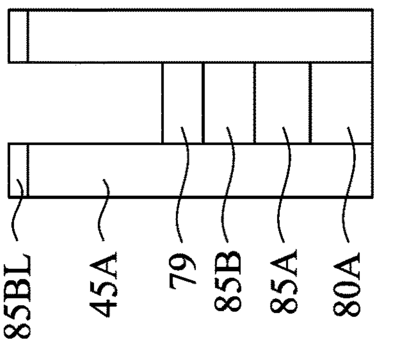
FIG. 3E 50
46
44
42
40
30
20
10
Z
X 30
20
10
Z
X 20
10
Z
X 170
160
50
10

150

152

170

170
160
50
10

180

190L 190L
180

METHOD OF MANUFACTURING SEMICONDUCTOR DEVICES INCLUDING A CAP INSULATING LAYER

RELATED APPLICATIONS

This application claims priority to U.S. Provisional Patent Application No. 63/299,205 filed on Jan. 13, 2022, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET using nano-structures (e.g., nanosheets or nanowires). In a FinFET, a gate electrode is adjacent to three side surfaces of a channel region with a gate dielectric layer interposed therebetween. A gate electrode of a FinFET includes one or more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F and 3G show various stages of a sequential process for manufacturing a semiconductor device according to an embodiment of the present disclosure.

DETAILED DESCRIPTION

Figure 1D:
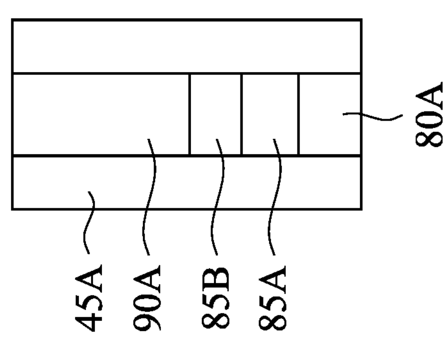
FIGS. 1A, 1B, 1C and 1D show various stages of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term “made of” may mean either “comprising” or “consisting of.” Further, in the following fabrication process, there may be one or more additional operations in between the described operations, and the order of operations may be changed. In the present disclosure, a phrase “one of A, B and C” means “A, B and/or C” (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

In a semiconductor manufacturing process, various metal filling processes are employed to fill a space, hole or opening formed in or by a dielectric material. In some embodiments, the metal filling process is used to form a via or a contact connecting a lower conductive layer and an upper conductive layer. In some embodiments, the metal filling process is used to form a metal gate electrode in a gate replacement technology.

In a gate replacement technology, a sacrificial gate structure including a sacrificial gate electrode (made of, for example, polysilicon) is first formed over a channel region and subsequently is replaced with a metal gate structure. In metal gate FinFETs or GAA FETs, various metal materials, such as a barrier layer, a work function adjustment layer, an adhesion layer or a body metal layer, are filled in a space from which a sacrificial gate structure is removed. In some FET devices, after the gate replacement process to form a metal gate structure, an upper portion of the metal gate structure is recessed and a cap insulating layer is formed over the recessed gate structure to secure an isolation region between the metal gate electrode and adjacent conductive contacts. Further, in advanced FET devices, various FETs (n-channel and p-channel FETs) with different threshold voltages are fabricated in one device and FETs may have different metal (e.g., work function adjustment metals) structures.

In a via or contact formation, a space, hole or opening is formed in a dielectric layer, and the space, hole or opening is filled by one or more conductive layers. In some embodiments, an electro-plating process is used to form a conductive layer, which generally requires a seed layer for a conductive layer to grow. In some embodiments, one or more barrier layers to suppress metal diffusion from an upper layer to a lower layer are used in the hole.

In the present disclosure, novel processes for forming one or more conductive layers in a space, hole or opening to form a bottom-only cap layer, which improves a bottom coverage by the conductive layer and improve a process window are disclosed.

FIGS. 1A-1D show a sequential process for manufacturing an FET device according to an embodiment of the present disclosure. It is understood that additional operations can be provided before, during, and after processes shown by FIGS. 1A-1D, and some of the operations described below can be replaced or eliminated, for additional embodiments of the method. The order of the operations/processes may be interchangeable.

Figure 1C:
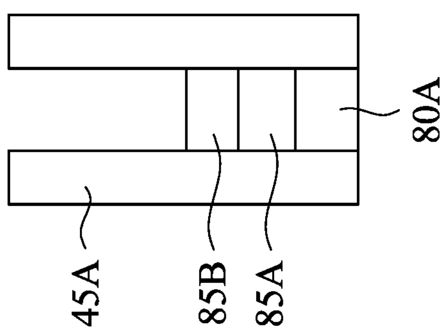

In some embodiments, a space, hole or opening 49A is formed by a dielectric layer 45A. In some embodiments, a lower conductive layer 80A is disposed at the bottom of the opening 49A as shown in FIG. 1A. In some embodiments, the dielectric layer 45A is a gate sidewall spacer and the opening 49A is a gate space from which a sacrificial gate structure is removed. The lower conductive layer 80A is one or more layers of conductive material, such as a work function adjustment layer. In other embodiments, the dielectric layer 45A is an interlayer dielectric (ILD) layer and the lower conductive layer 80A is a lower metal wiring pattern. In some embodiments, the lower conductive layer 80A is a semiconductor layer, such as a source/drain epitaxial layer, and the dielectric layer 45A is an ILD layer. In some embodiments, an aspect ratio (height/width) of the opening 49A is in a range from about 1.25 to about 7. When the opening 49A has a rectangular shape in plan view, the width is a shorter side of the rectangular shape.

Figure 1B:
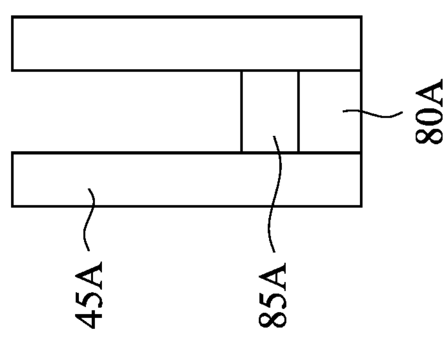
Figure 1A:
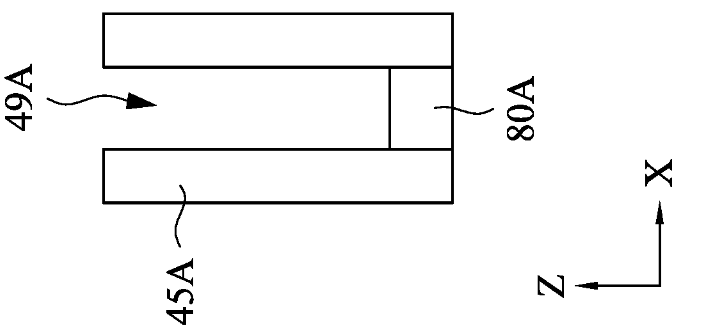

In some embodiments, a first conductive layer 85A is formed over the lower conductive layer 80A as shown in FIG. 1B. In some embodiments, the first conductive layer 85A is selectively formed on the lower conductive layer 80A by atomic layer deposition (ALD). Thus, the first conductive layer 85A is in contact with the sidewall of the dielectric layer 45A not higher than the height of the first conductive layer 85A. In some embodiments, the first conductive layer is not formed on the upper surface of the dielectric layer 45A.

In some embodiments, the first conductive layer 85A is made of tungsten formed by ALD using $WCl_5$ gas as a precursor or molybdenum formed by ALD using $MoCl_5$ gas as a precursor. When a metal penta-chloride is used as a precursor of ALD (or chemical vapor deposition (CVD)), the metal layer does not grow on a dielectric layer and selectively grows on a conductive layer. In some embodiments, the conductive layer (e.g., the lower conductive layer 80A) includes Ti, Ta, TiAl TiAlC, TiN, TiSiN, TaN, TaSiN, WN, WCN, or conductive metal oxide. In some embodiments, the thickness of the first conductive layer 85A is in a range from about 1 nm to about 10 nm and is in a range from about 2 nm to about 6 nm, depending on device and/or process requirements.

In some embodiments, the ALD process using the metal penta-chloride is performed at a substrate temperature in a range from about 400° C. to about 500° C., at a precursor temperature in a range from about 100° C. to about 150° C., and at a pressure in a range from about 10 Torr to about 50 Torr. In some embodiments, hydrogen gas ($H_2$) as a reducing gas and argon gas as a carrier gas are introduced with the precursor gas, and HCl gas as by-product is exhausted. In some embodiments, the flatness of the upper surface of the first conductive layer 85A (peak-to-bottom of the upper surface) is in a range from about 0.1 nm to about 1 nm. In some embodiments, the first conductive layer 85A includes chlorine in an amount of about 1 ppm to about 100 ppm, and is free of fluorine.

Then, as shown in FIG. 1C, a second conductive layer 85B is formed over the first conductive layer 85A. In some embodiments, the second conductive layer 85B is selectively formed on the first conductive layer 85A by ALD. Thus, the second conductive layer 85B is in contact with the sidewall of the dielectric layer 45A not higher than the height of the second conductive layer 85B. In some embodiments, the second conductive layer is not formed on the upper surface of the dielectric layer 45A.

In some embodiments, the second conductive layer 85B is made of tungsten formed by ALD using $WF_6$ gas as a precursor. When a metal fluoride is used as a precursor of ALD (or CVD), the metal layer does not grow on the dielectric layer and selectively grows on the conductive layer. In some embodiments, the thickness of the second conductive layer 85B is in a range from about 1 nm to about 10 nm and is in a range from about 2 nm to about 6 nm, depending on device and/or process requirements.

In some embodiments, the ALD process using the $WF_6$ gas is performed at a substrate temperature in a range from about 200° C. to about 400° C. (lower than the ALD process for the first conductive layer 85A), at a precursor temperature in a range from about 10° C. to about 30° C. (lower than the ALD process for the first conductive layer 85A, e.g., room temperature), and at a pressure in a range from about 10 Torr to about 50 Torr. In some embodiments, hydrogen gas ($H_2$) as a reducing gas and argon gas as a carrier gas are introduced with the precursor gas, and HF gas as by-product is exhausted. In some embodiments, the flatness of the upper surface of the second conductive layer 85B (peak-to-bottom of the upper surface) is in a range from about 0.1 nm to about 1 nm. In some embodiments, the second conductive layer 85B includes fluorine in an amount of about 1 ppm to about 100 ppm, and is free of chlorine.

In some embodiments, no dry etching process to remove an undesired portion of the first conductive layer formed on the dielectric layer, if any, is performed before the second conductive layer 85B is formed. Similarly, no dry etching process to remove an undesired portion of the second conductive layer formed on the dielectric layer, if any, is performed after the second conductive layer 85B is formed.

After the second conductive layer 85B is formed, an upper layer 90A is formed over the second conductive layer 85B as shown in FIG. 1D. In some embodiments, the upper layer 90A includes one or more additional conductive layers (e.g., tungsten, copper, cobalt, ruthenium, etc.) or one or more dielectric layers (e.g., silicon oxide, silicon nitride, SiON, SiOC, SiOCN, etc.). In some embodiments, no second conductive layer is formed, and the upper layer 90A is formed on the first conductive layer 85A. As shown in FIG. 1D, neither of the first or the second conductive layers has a U-shape cross section.

FIGS. 2A-2H show a sequential process for manufacturing an FET device according to an embodiment of the present disclosure. It is understood that additional operations can be provided before, during, and after the processes shown by FIGS. 2A-2H, and some of the operations described below can be replaced or eliminated, for additional embodiments of the method. The order of the operations/processes may be interchangeable.

Figure 2D:
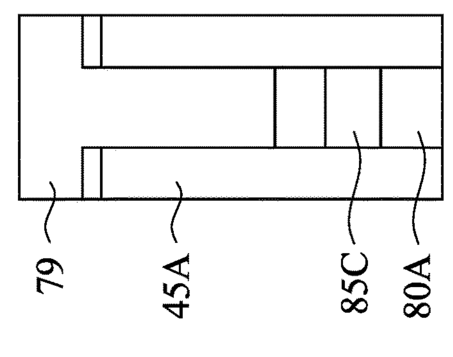
FIGS. 2A, 2B, 2C, 2D, 2E, 2F, 2G, 2H, 2I and 2J show various stages of a sequential process for manufacturing a semiconductor device according to an embodiment of the present disclosure.
Figure 2H:
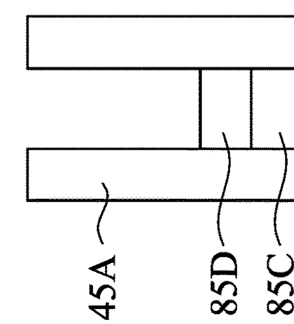
Figure 2C:
Figure 2C:
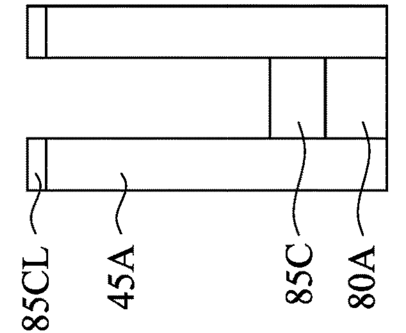
Figure 2G:
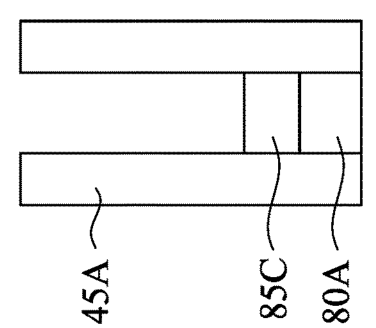
Figure 2B:
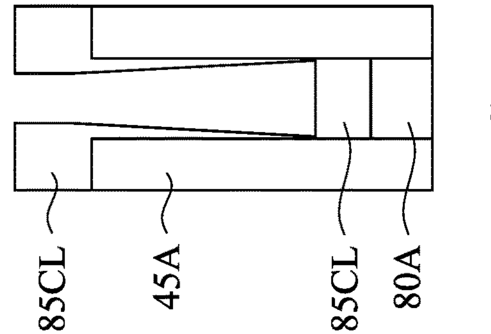
Figure 2F:
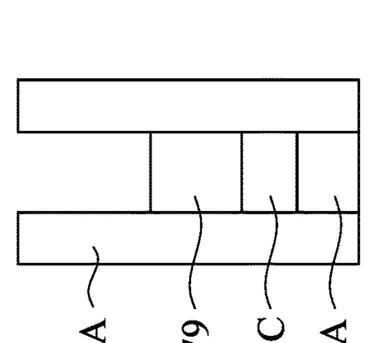
Figure 2A:
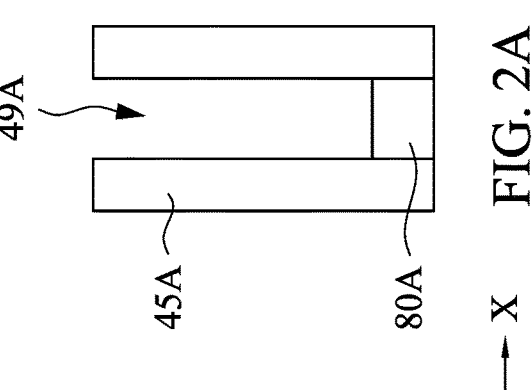
Figure 2A:
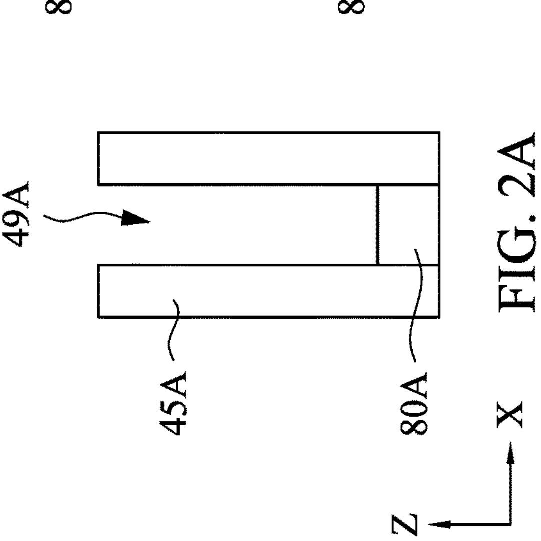

FIG. 2A is the same as FIG. 1A. In some embodiments, a blanket conductive layer 85CL for a third conductive layer is formed over the lower conductive layer 80A as shown in FIG. 2B. In some embodiments, the blanket conductive layer 85CL is formed by physical vapor deposition (PVD), such as a sputtering process, or CVD. In some embodiments, as shown in FIG. 2B, the blanket conductive layer 85CL is also formed on the sidewall of the dielectric layer 45A in the opening 49A and on the upper surface of the dielectric layer 45A. In some embodiments, the thickness of the blanket conductive layer 85CL as deposited on the lower conductive layer 80A is greater than the thickness on the sidewall of the dielectric layer 45A. In some embodiments, the thickness of the blanket conductive layer 85CL as deposited on the lower conductive layer 80A is equal to or smaller than the thickness on the upper surface of the dielectric layer 45A.

In some embodiments, the blanket conductive layer 85CL includes a metal, a conductive metal nitride/oxide, or a semiconductor material. The metal material includes one or more of W, Ti, Ta, Co, Ni, Mo, Ru, Cu, Al or alloy thereof. The conductive metal nitride or oxide includes TiN, TaN, WN WCN, $SnO_2$, etc. The semiconductor material includes one or more of Si, Ge, SiGe, GaAs, InSb, GaP, GaSb, InAlAs, InGaAs, GaSbP, GaAsSb and InP. In some embodiments, the blanket layer 85CL is made of the same material as the lower conductive layer 80A. In certain embodiments, the blanket layer 85CL is a dielectric layer.

In the PVD (sputtering) process, when the ion density is greater, deposition on the sidewall of the dielectric layer 45A is suppressed. In some embodiments, the sputtering process is performed at a temperature in a range from about 25° C. to about 500° C., at a pressure in a range from about 20 mTorr to about 500 mTorr, with an RF power in a range from about 2 kW to about 4 kW and with a RF bias in a range from about 50 V to 300V. In some embodiments, the blanket layer 85CL is free from chlorine and fluorine.

Then, as shown in FIG. 2C, part of the blanket conductive layer 85CL deposited on the sidewall of the dielectric layer 45A is removed. In some embodiments, a wet etching process using de-ionized water, ozone water, $H_2O_2$, acid (HF, HCl, $H_2SO_4$, $H_3PO_4$, etc.), and/or ammonia water is used. In some embodiments, the wet etchant is a mixture of $NH_4OH$, $H_2O_2$ and $H_2O$ or a mixture of HCl, $H_2O_2$ and $H_2O$. In some embodiments, a dry etching process using a fluorine containing gas (e.g., $CF_4$), chlorine containing gas ($BCl_3$), etc. followed by the wet etching process as set forth above is used. In some embodiments, a directional etching process is used to remove the portion of the blanket layer 85CL on the sidewall of the dielectric layer 45A. In the directional etching process, active species are applied at an angle of about 10 degrees to about 60 degrees with respect to the upper surface of the dielectric layer 45A. As shown in FIG. 2C, after the portion of the blanket layer 85CL on the sidewall of the dielectric layer 45A is removed, portions of the blanket layer 85CL on the lower conductive layer 80A and the upper surface of the dielectric layer 45A remain. The thickness of the remaining conductive layer, i.e. a third conductive layer 85C, is in a range from about 1 nm to about 10 nm in some embodiments, and is in a range from about 2 nm to about 6 nm in other embodiments. In some embodiments, the flatness of the upper surface of the third conductive layer 85C (peak-to-bottom of the upper surface) is in a range from about 0.1 nm to about 1 nm.

Next, as shown in FIG. 2D, a filling material layer 79 is formed in the opening 49A and on the upper surface of the dielectric layer 45A on which the blanket conductive layer 85CL remains. In some embodiments, the filling material layer 79 includes an organic material, such as polymer. In some embodiments, the filling material layer 79 is a photo resist layer or a bottom antireflective coating (BARC) layer.

Figure 2E:
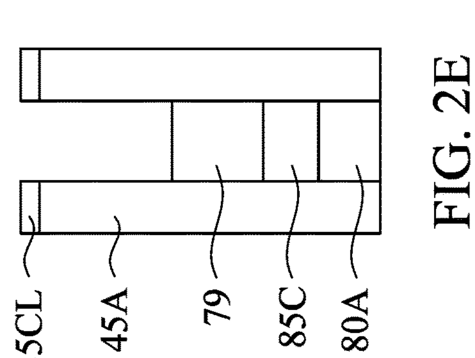

Then, as shown in FIG. 2E, the filling material layer 79 is recessed by an etching-back operation to exposed the remining blanket layer 85CL on the upper surface of the dielectric layer 45A while protecting the third conductive layer 85C by the filling material layer 79.

Further, the remining blanket layer 85CL on the upper surface of the dielectric layer 45A is removed by the wet etching operation and/or the dry etching operation as set forth above as shown in FIG. 2F, and then the filling material 79 in the opening 49A is removed as shown in FIG. 2G.

In some embodiments, as shown in FIG. 2H, a fourth conductive layer 85D, which is consistent with the first conductive layer 85A is further formed over the third conductive layer 85C by the ALD process as set forth above. In some embodiments, similar to FIG. 1D, an upper layer that includes one or more additional conductive layers (e.g., tungsten, copper, cobalt, ruthenium, etc.) or one or more dielectric layers (e.g., silicon oxide, silicon nitride, SiON, SiOC, SiOCN, etc.) is further formed on the fourth conductive layer 85D. In other embodiments, no fourth conductive layer is formed on the third conductive layer 85C, and one or more additional conductive layers or one or more dielectric layers are formed on the third conductive layer 85C. In other embodiments, a fifth conductive layer consistent with the second conductive layer 85B is formed on the fourth conductive layer 85D formed on the third conductive layer 85C.

Figure 2J:
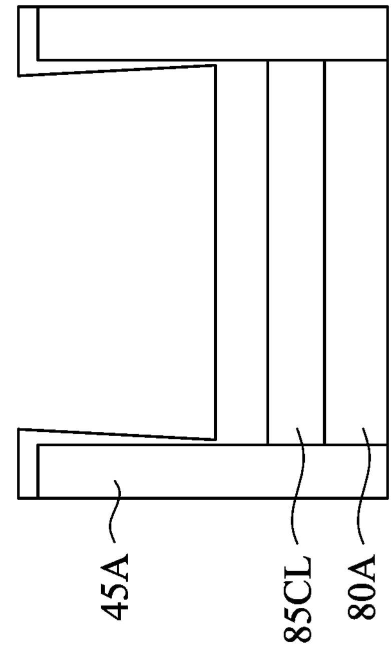
Figure 2I:
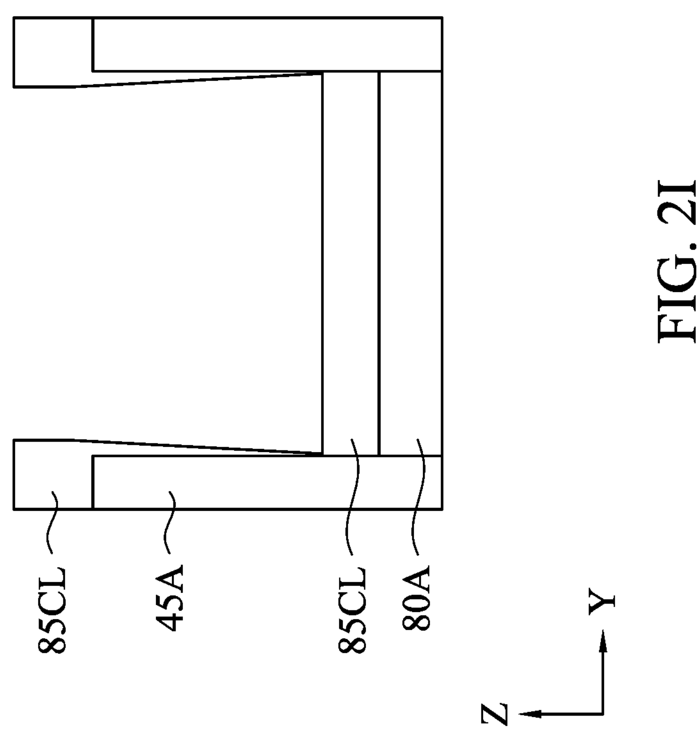

FIGS. 2I and 2J are cross sectional view along the Y direction, corresponding to FIGS. 2B and 2C which are cross sectional views along the X direction. In some embodiments, when a directional etching operation is used to remove the part of the blanket conductive layer 85CL and the shape of the opening 49A in plan view is rectangular, a part of the blanket conductive layer 85CL remains on sidewalls on shorter sides of the opening 49A as shown in FIGS. 2I and 2J.

FIGS. 3A-3G show a sequential process for manufacturing an FET device according to an embodiment of the present disclosure. It is understood that additional operations can be provided before, during, and after the processes shown by FIGS. 3A-3G, and some of the operations described below can be replaced or eliminated, for additional embodiments of the method. The order of the operations/processes may be interchangeable.

FIG. 3A is the same as FIG. 1B. In some embodiments, the first conductive layer 85A is formed by the ALD process as set forth above, or by the sputtering process followed by the removal process as set forth above.

In some embodiments, a blanket conductive layer 85BL for the second conductive layer is formed over the first conductive layer 85A as shown in FIG. 3B. In some embodiments, the blanket conductive layer 85BL is formed by PVD, such as a sputtering process, or CVD. The process conditions of the PVD (sputtering) process are same as those explained above. In some embodiments, as shown in FIG. 3B, the blanket conductive layer 85BL is also formed on the sidewall of the dielectric layer 45A in the opening 49A and on the upper surface of the dielectric layer 45A. In some embodiments, the thickness of the blanket conductive layer 85BL as deposited on the first conductive layer 85A is greater than the thickness on the sidewall of the dielectric layer 45A. In some embodiments, the thickness of the blanket conductive layer 85BL as deposited on the first conductive layer 85A is equal to or smaller than the thickness on the upper surface of the dielectric layer 45A.

In some embodiments, the blanket conductive layer 85BL includes metal, conductive metal nitride/oxide, or semiconductor material. The metal material includes one or more of W, Ti, Ta, Co, Ni, Mo, Ru, Cu, Al or alloy thereof. The conductive metal nitride or oxide includes TiN, TaN, WN WCN, $SnO_2$, etc. The semiconductor material includes one or more of Si, Ge, SiGe, GaAs, InSb, GaP, GaSb, InAlAs, InGaAs, GaSbP, GaAsSb and InP. In certain embodiments, the blanket layer 85BL is a dielectric layer.

Then, as shown in FIG. 3C, part of the blanket conductive layer 85BL deposited on the sidewall of the dielectric layer 45A is removed. In some embodiments, a wet etching process using de-ionized water, ozone water, $H_2O_2$, acid (HF, HCl, $H_2SO_4$, $H_3PO_4$, etc.), and/or ammonia water is used. In some embodiments, the wet etchant is a mixture of $NH_4OH$, $H_2O_2$ and $H_2O$ or a mixture of HCl, $H_2O_2$ and $H_2O$. In some embodiments, a dry etching process using a fluorine containing gas (e.g., $CF_4$), a chlorine containing gas ($BCl_3$), etc. followed by the wet etching process as set forth above is used. In some embodiments, a directional etching process is used to remove the portion of the blanket layer 85BL on the sidewall of the dielectric layer 45A. In the directional etching process, active species are applied at an angle of about 10 degrees to about 60 degrees with respect to the upper surface of the dielectric layer 45A. As shown in FIG. 3C, after the portion of the blanket layer 85BL on the sidewall of the dielectric layer 45A is removed, portions of the blanket layer 85BL on the first conductive layer 85A and the upper surface of the dielectric layer 45A remain. The thickness of the remaining conductive layer, i.e. the second conductive layer 85B, is in a range from about 1 nm to about 10 nm in some embodiments, and is in a range from about 2 nm to about 6 nm in other embodiments. In some embodiments, the flatness of the upper surface of the second conductive layer 85B (peak-to-bottom of the upper surface) is in a range from about 0.1 nm to about 1 nm.

Next, as shown in FIG. 3D, a filling material layer 79 is formed in the opening 49A and on the upper surface of the dielectric layer 45A on which the blanket conductive layer 85BL remains. In some embodiments, the filling material layer 79 includes an organic material, such as polymer. In some embodiments, the filling material layer 79 is a photo resist layer or a BARC layer.

Then, as shown in FIG. 3E, the filling material layer 79 is recessed by an etching-back operation to expose the remaining blanket layer 85BL on the upper surface of the dielectric layer 45A while protecting the second conductive layer 85B by the filling material layer 79.

Further, the remaining blanket layer 85BL on the upper surface of the dielectric layer 45A is removed by the wet etching operation and/or the dry etching operation as set forth above, as shown in FIG. 3F, and then the filling material 79 in the opening 49A is removed as shown in FIG. 3G.

In some embodiments, similar to FIG. 1D, an upper layer that includes one or more additional conductive layers (e.g., tungsten, copper, cobalt, ruthenium, etc.) or one or more dielectric layers (e.g., silicon oxide, silicon nitride, SiON, SiOC, SiOCN, etc.) is further formed on the second conductive layer 85B. In other embodiments, before the first and second conductive layers are formed, the upper layer is formed on the lower conductive layer 80A, as set forth above.

FIGS. 4A-8C show various stages of a gate replacement process for an FET device according to an embodiment of the present disclosure. It is understood that additional operations can be provided before, during, and after processes shown by FIGS. 4A-8C, and some of the operations described below can be replaced or eliminated, for additional embodiments of the method. The order of the operations/processes may be interchangeable.

Figures 4A, 4B, 4C:
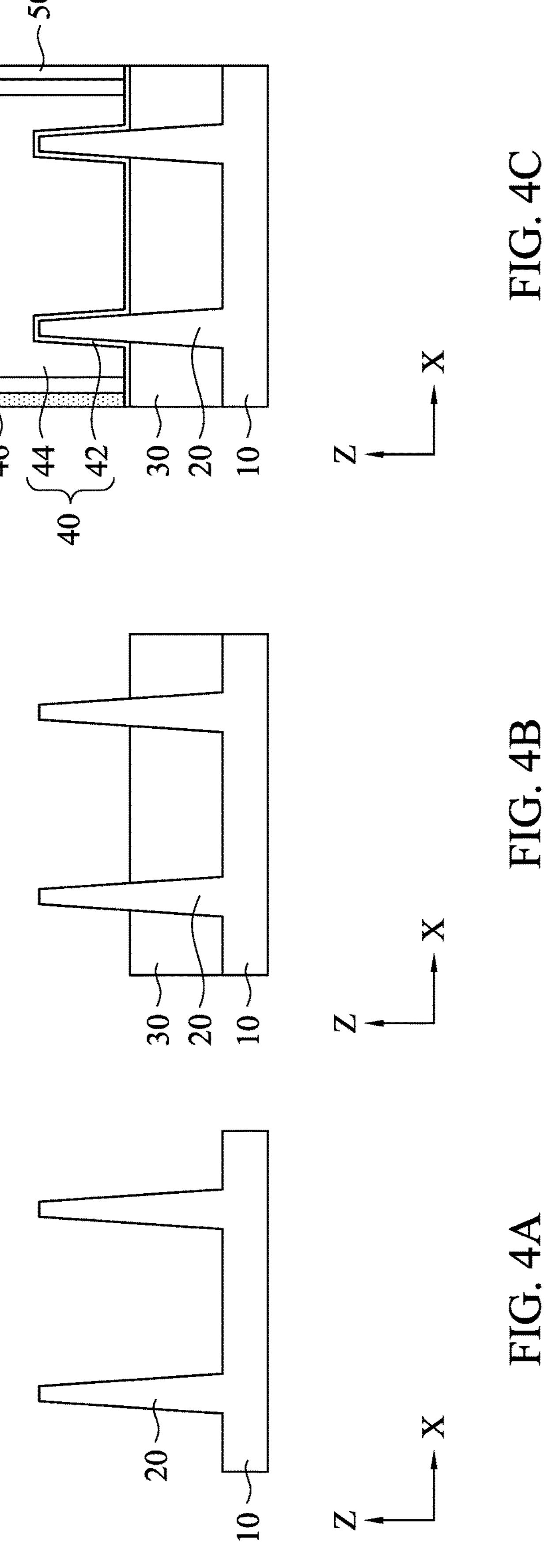
FIGS. 4A, 4B, 4C, 4D, 4E and 4F show various stages of a sequential process for manufacturing a semiconductor device according to an embodiment of the present disclosure.

As shown in FIG. 4A, one or more fin structures 20 are fabricated over a substrate 10. The substrate 10 is, for example, a p-type silicon substrate with an impurity concentration in a range of about $1\times10^{15}$ $cm^{-3}$ to about $1\times10^{18}$ $cm^{-3}$. In other embodiments, the substrate 10 is an n-type silicon substrate with an impurity concentration in a range of about $1\times10^{15}$ $cm^{-3}$ to about $1\times10^{18}$ $cm^{-3}$. Alternatively, the substrate 10 may comprise another elementary semiconductor, such as germanium; a compound semiconductor including Group IV-IV compound semiconductors, such as SiC and SiGe; Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or an insulating material, such as silicon oxide may also be used as the substrate 10. The substrate 10 may include various regions that have been suitably doped with impurities (e.g., p-type or n-type conductivity). In some embodiments, a part of the substrate 10 for p-type FETs is recessed by etching and a SiGe layer is formed over the recesses. FIGS. 4A-4F show the case of an n-type FET, but most of the fabrication process is substantially the same for a p-type FET.

The fin structures 20 can be patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and is patterned using a photolithography process. Spacers are formed alongside the patterned sacrificial layer using a self-aligned process. The sacrificial layer is then removed, and the remaining spacers may then be used to pattern the fin structures 20.

As shown in FIG. 4A, two fin structures 20 extending in the Y direction are disposed adjacent to each other in the X direction. However, the number of the fin structures is not limited to two. The numbers may be one, three, four or five or more. In addition, one or more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 15 nm in other embodiments. One skilled in the art will realize, however, that the dimensions and values recited throughout the descriptions are merely examples, and may be changed to suit different scales of integrated circuits.

After the fin structures 20 are formed, an isolation insulating layer 30 is formed over the fin structures 20, as shown in FIG. 4B. The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (e.g., the pad oxide layer and the silicon nitride mask layer formed on the pad oxide layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 4B. In certain embodiments, the partial removing of the isolation insulating layer 30 is performed using a wet etching process, for example, by dipping the substrate in hydrofluoric acid (HF). In another embodiment, the partial removing of the isolation insulating layer 30 is performed using a dry etching process. For example, a dry etching process using $CHF_3$ or $BF_3$ as etching gases may be used. After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Then, a dummy gate structure 40 is formed over part of the fin structures 20 as shown in FIG. 4C. A dielectric layer and a poly silicon layer are formed over the isolation insulating layer 30 and the exposed fin structures 20, and then patterning operations are performed so as to obtain a dummy gate structure 40 including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 can be silicon oxide formed by CVD, physical vapor deposition (PVD), atomic layer deposition (ALD), e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer 42 is in a range of about 1 nm to about 5 nm.

In some embodiments, the dummy gate electrode layer 44 is doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one or more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Figure 4F:
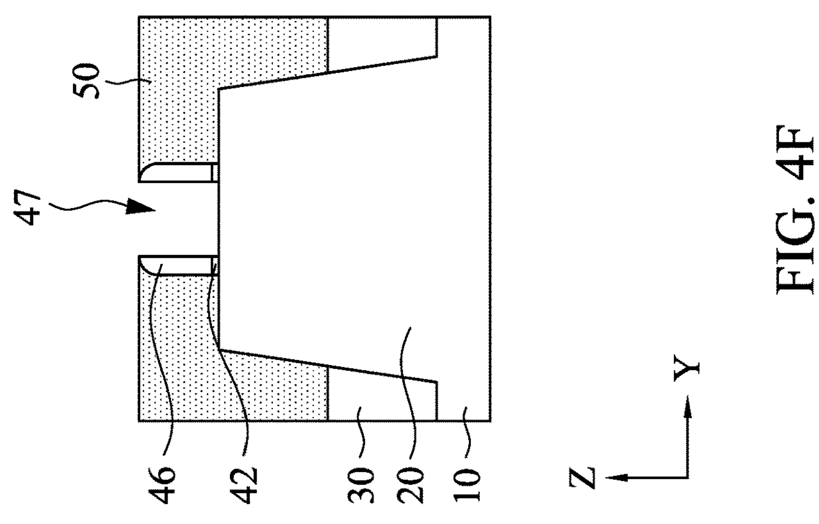
Figure 4E:
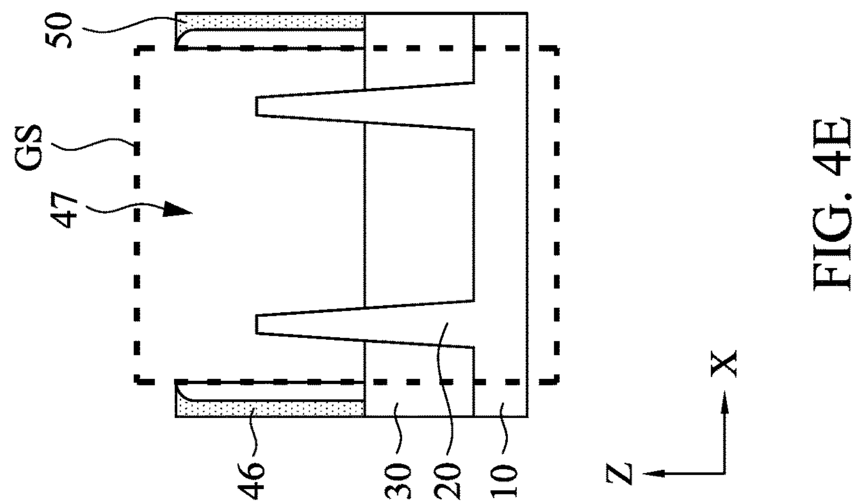
Figure 4D:
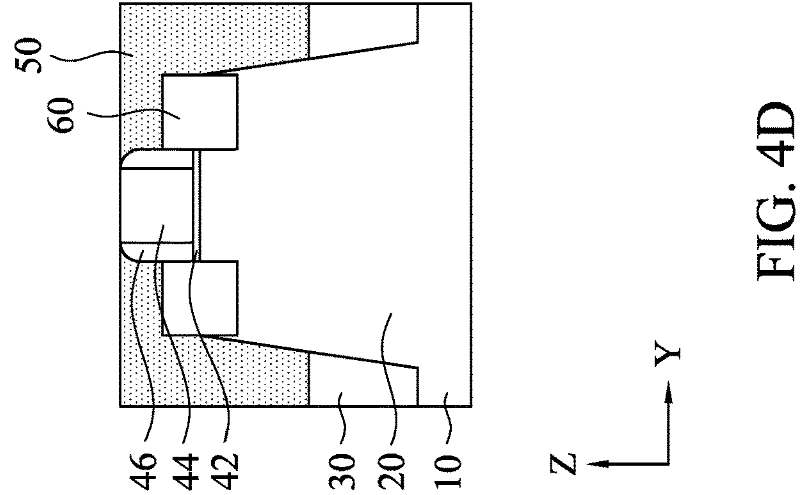

Further, as shown in FIGS. 4C and 4D, sidewall spacers 46 are formed on opposite side faces of the dummy gate structures 40. FIG. 4D is a cross section in the y-z plane. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming gate sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers 60 are formed in the source/drain recess as shown in FIG. 4D. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe or Ge doped with B for a p-type FinFET. An amount of P (phosphorus) in the first epitaxial layer is in a range from about $1\times10^{18}$ atoms/$cm^3$ to about $1\times10^{20}$ atoms/$cm^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range of about $1\times10^{20}$ atoms/$cm^3$ to about $2\times10^{20}$ atoms/$cm^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer includes a SiP epitaxial layer in some embodiments. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/$cm^3$ to about $1\times10^{21}$ atoms/$cm^3$ in some embodiments. When the third epitaxial layer is SiGe, an amount of Ge is less than about 20 atomic % in some embodiments, and is about 1 atomic % to about 18 atomic % in other embodiments.

In at least one embodiment, the source/drain epitaxial layers 60 are epitaxially-grown by an LPCVD process, molecular beam epitaxy, atomic layer deposition or any other suitable method. The LPCVD process is performed at a temperature of about 400° C. to about 850° C. and under a pressure of about 1 Torr to about 200 Torr, using a silicon source gas, such as $SiH_4$, $Si_2H_6$, or $Si_3H_8$; a germanium source gas, such as $GeH_4$, or $Ge_2H_6$; a carbon source gas, such as $CH_4$ or $SiH_3CH_3$; and phosphorus source gas, such as $PH_3$.

Still referring to FIGS. 4C and 4D, an interlayer dielectric (ILD) layer 50 is formed over the S/D epitaxial layer 60 and the dummy gate structure 40. The materials for the ILD layer 50 include compounds comprising Si, O, C and/or H, such as silicon oxide, SiCOH and SiOC. Organic materials, such as polymers, may also be used for the ILD layer 50.

After the ILD layer 50 is formed, a planarization operation, such as CMP, is performed, so that the top portion of the dummy gate electrode layer 44 is exposed, as shown in FIG. 4D. In some embodiments, before the ILD layer 50 is formed, a contact etch stop layer, such as a silicon nitride layer or a silicon oxynitride layer, is formed.

Then, the dummy gate electrode layer 44 and the dummy gate dielectric layer 42 are removed, thereby forming a gate space 47 as shown in FIGS. 4E and 4F. FIG. 4F is a cross section along the Y direction (source-to-drain direction). The dummy gate structures can be removed using plasma dry etching and/or wet etching. When the dummy gate electrode layer 44 is polysilicon and the ILD layer 50 is silicon oxide, a wet etchant such as a TMAH solution can be used to selectively remove the dummy gate electrode layer 44. The dummy gate dielectric layer 42 is thereafter removed using plasma dry etching and/or wet etching.

In some embodiments, the gate space 47 corresponds to the opening 49A and the sidewall spacers 46 correspond to the dielectric layer 45A as shown in FIGS. 1A-3G.

Figure 5B:
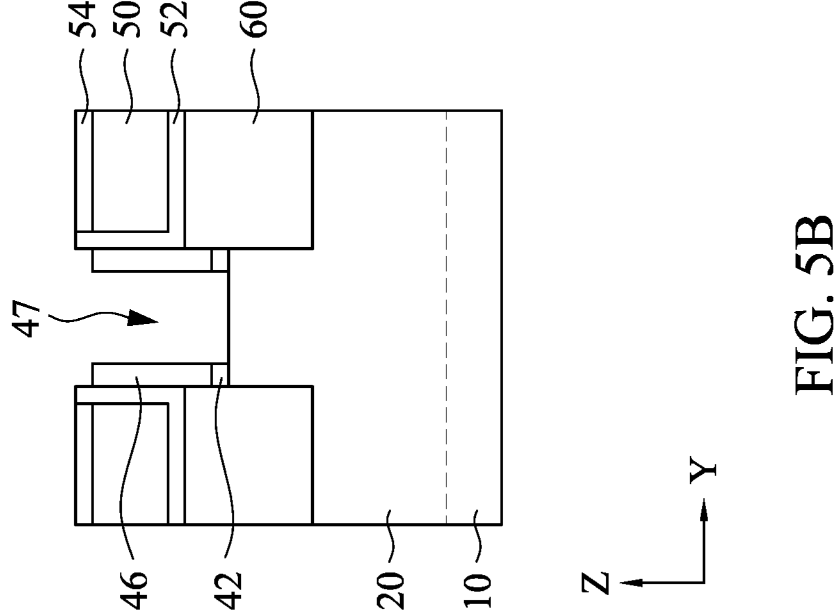
FIGS. 5A, 5B, 5C and 5D show one of the various stages of a sequential process for manufacturing a semiconductor device according to an embodiment of the present disclosure.
Figure 5A:
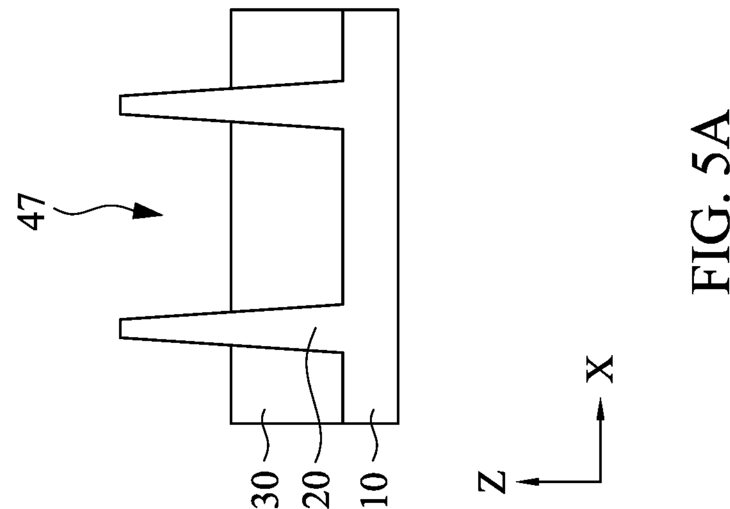
Figure 5D:
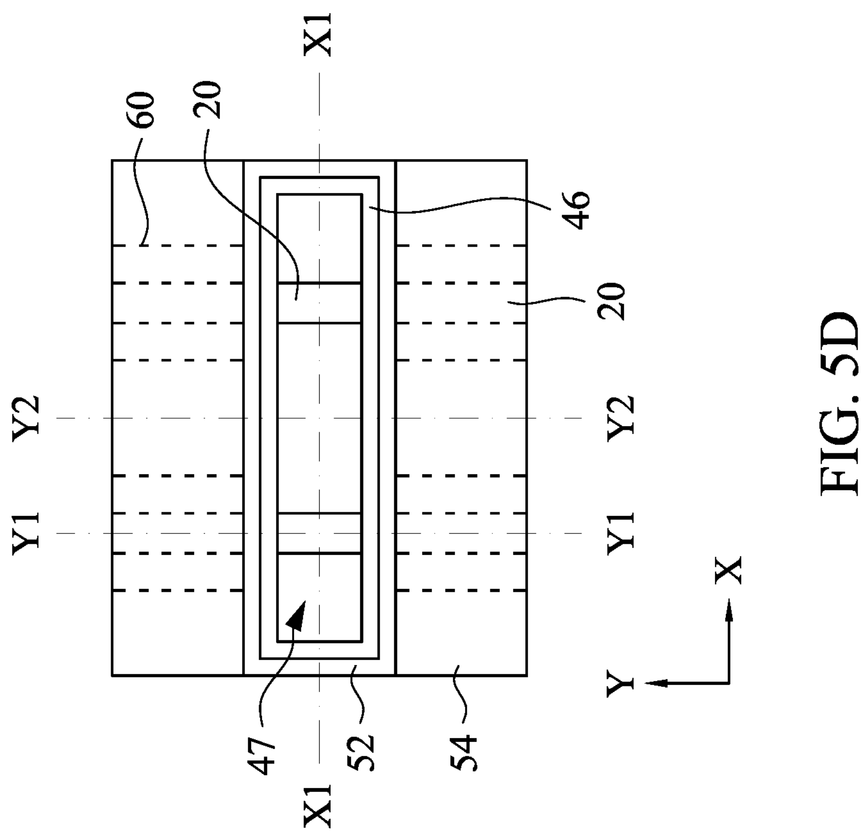
Figure 5C:
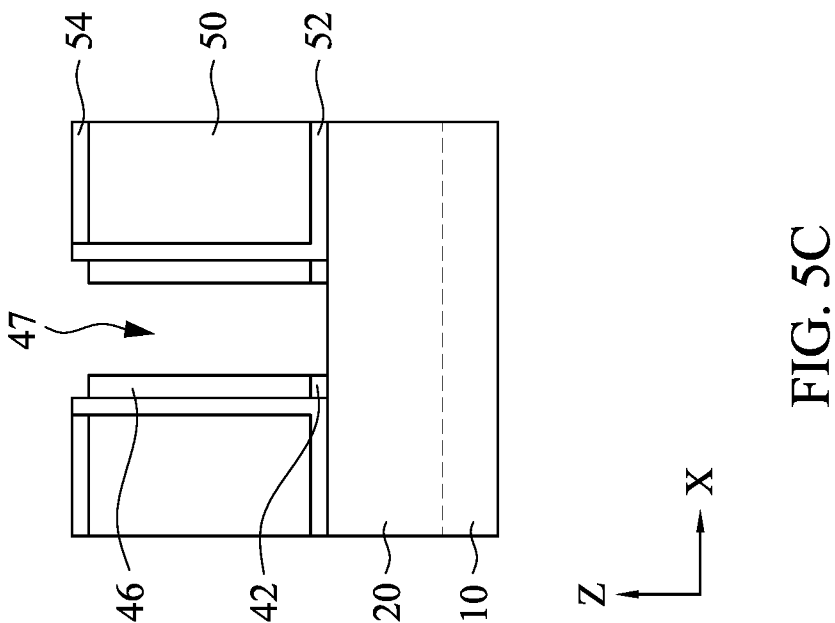

FIGS. 5A-5D show various views after the sacrificial gate structure (sacrificial gate electrode 44 and sacrificial gate dielectric layer 42) is removed, thereby forming a gate space 47, as described above. FIG. 5A is a cross sectional view along X1-X1 of FIG. 5D (a plan or projected view), FIG. 5B is a cross sectional view along Y1-Y1 of FIG. 5D and FIG. 5C is a cross sectional view along Y2-Y2 of FIG. 5D. In some embodiments, an insulating liner layer 52 functioning as an etching stop layer is formed before the ILD layer 50 is formed. In some embodiments, the insulating liner layer 52 includes silicon nitride. In some embodiments, an additional dielectric layer 54 is formed over the ILD layer 50. In some embodiments, the additional dielectric layer 54 includes silicon nitride.

In some embodiments, an upper portion of the gate sidewall spacer 46 is recessed as shown in FIGS. 5B and 5C. In some embodiments, the gate sidewall spacers 46 are recessed during the removal of the sacrificial gate dielectric layer, and in other embodiments, one or more dry and/or wet etching operations are performed to recess the gate sidewall spacers 46. In some embodiments, after the gate sidewall spacers 46 are recessed, the uppermost surface is made of only a silicon nitride based material (e.g., silicon nitride) (layers 52 and 54). In other embodiments, the recess etching of the gate sidewall spacers 46 is not performed, and the top of the gate sidewall spacers 46 is located at the same level as the top of the dielectric layer 54.

Figure 6C:
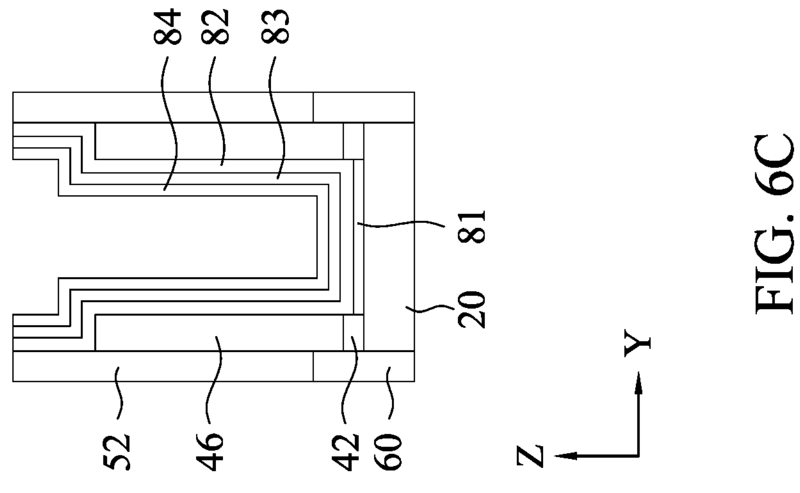
FIGS. 6A, 6B, 6C, 6D, 6E and 6F show various stages of a sequential process for manufacturing a semiconductor device according to an embodiment of the present disclosure.
Figure 6B:
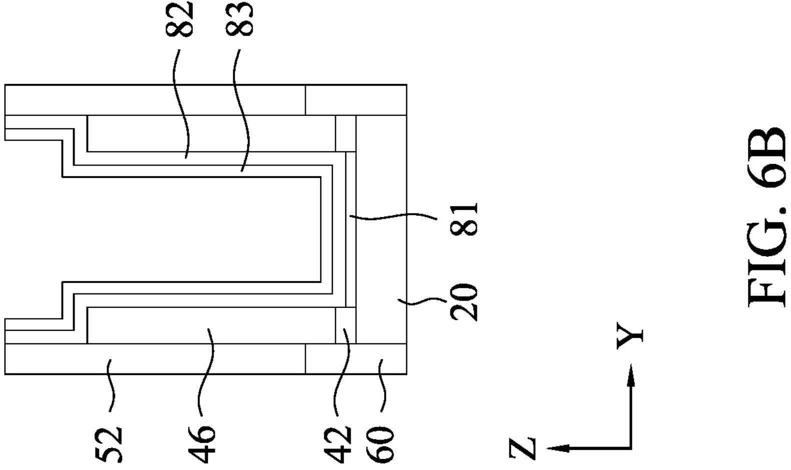
Figure 6A:
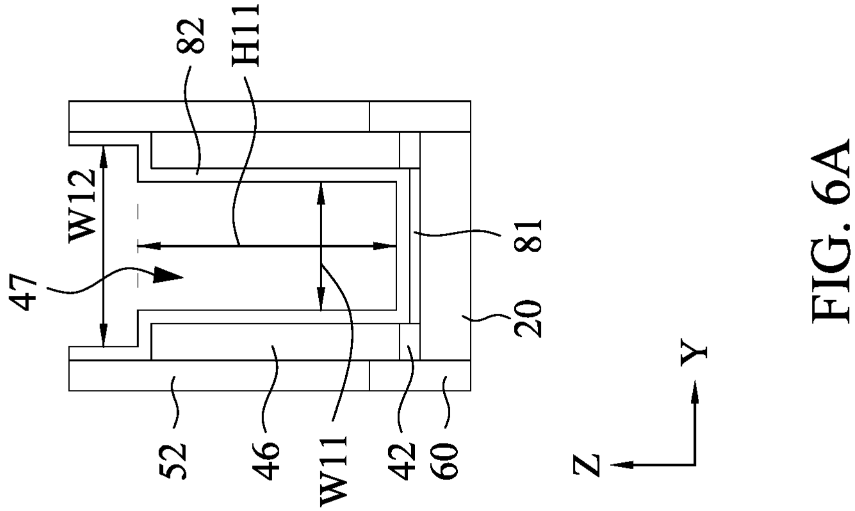

FIGS. 6A-8C are enlarged views of the gate space 47 and surrounding layers shown in FIG. 5B or 5C. As shown in FIG. 6A, an interfacial layer 81 is formed on the channel regions of the fin structures 20 and a gate dielectric layer 82 is formed over the interfacial layer and inner wall of the gate sidewall spacers 46 in some embodiments. In some embodiments, the gate dielectric layer 82 is formed over the upper surfaces of the etching stop layer 52 and the additional dielectric layer 54. The gate dielectric layer 82 is formed by an ALD process in some embodiments to conformally form a layer over a high aspect ratio structure. In some embodiments, the width W11 of the narrow portion of the gate space 47 measured at the center in the height of the narrow portion is smaller by an amount of 0.5 nm to about 20 nm than the width W12 of the wide portion of the gate space 47 measured at the center in the height of the wide portion, after the gate dielectric layer 82 is formed. In some embodiments, the aspect ratio of the narrow portion (height H11/width W11) of the gate space 47 is in a range from about 1.25 to about 7.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

Then, as shown in FIG. 6B, a barrier layer 83 is formed over the gate dielectric layer 82. In some embodiments, the barrier layer 83 includes one or more layers of Ta, TaN, Ti, TiN or TiSiN. In some embodiments, the thickness of the barrier layer is in a range from about 1 nm to about 3 nm. In some embodiments, the barrier layer 83 is not formed. In some embodiments, the thickness of the barrier layer 83 at the bottom is thicker than the thickness at the sides. In some embodiments, the thickness of the barrier layer 83 at the bottom is about 0.5 times to 3 times the thickness at the sides.

Further, as shown in FIG. 6C, one or more first work function adjustment material (WFM) layers 84 are formed over the barrier layer 83. In some embodiments, the first WFM layer 84 is a p-type WFM material, such as WN, WCN, W, Ru, Co, TiN or TiSiN. In some embodiments, the thickness of the first WFM layer is in a range from about 0.5 nm to about 10 nm and is in a range from about 1 nm to about 2 nm in other embodiments. In some embodiments, the thickness of the first WFM layer 84 at the bottom is about 0.8 times to twice the thickness at the side. When the first WFM layer is made of TiN, the TiN layer is formed from source gases including $TiCl_4$ and $NH_3$. In some embodiments, the TiN layer contains Cl as an impurity. In some embodiments, the Ti concentration in the TiN layer is in a range from about 10 atomic % to about 80 atomic %. When the Ti concentration is too small, the resistance of the TiN layer increases, and when the Ti concentration is too high, Ti diffusion may cause various problems (e.g., punch-through).

Figure 6F:
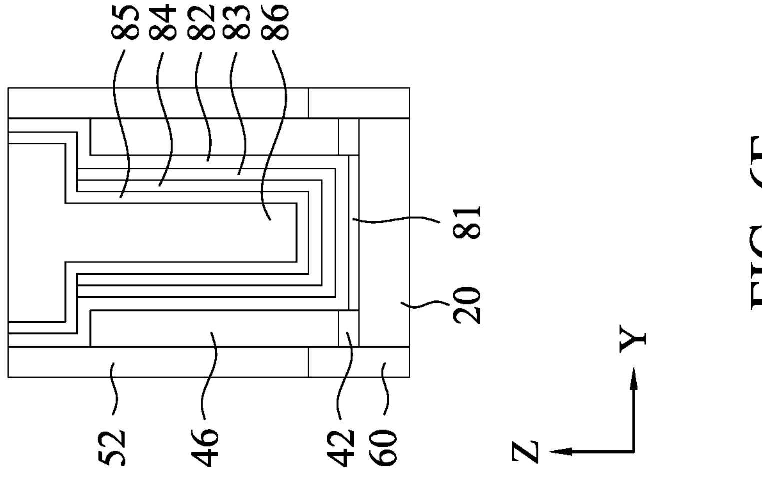
Figure 6E:
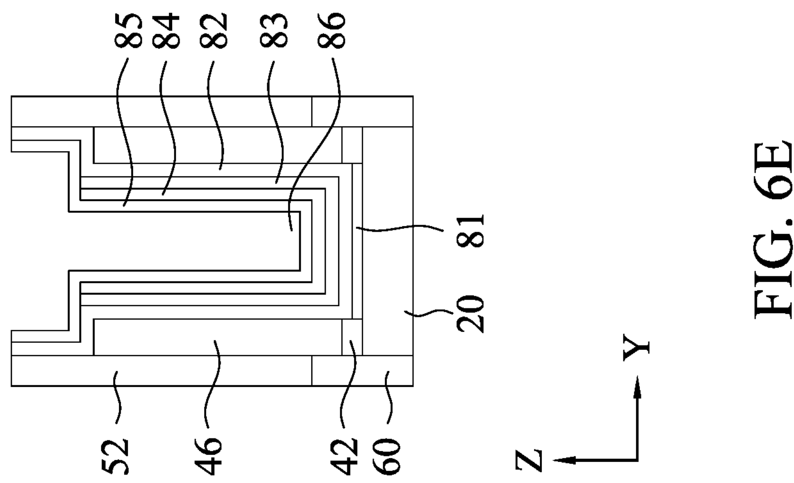
Figure 6D:
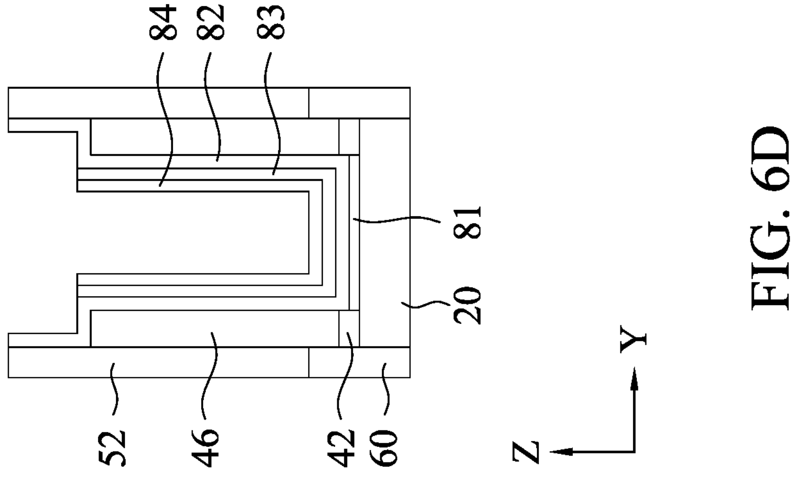

Then, as shown in FIG. 6D, an upper portion of the first WFM layer 84 is removed so that the uppermost portion of the first WFM layer 84 is below the uppermost portion of the etching stop layer 52 and the additional dielectric layer 66. In some embodiments, the uppermost portion of the first WFM layer 84 is below the uppermost portion of the gate sidewall spacers 46, and in other embodiments, the uppermost portion of the first WFM layer 84 is equal to or above the uppermost portion of the gate sidewall spacers 46 and below the uppermost portion of the etching stop layer 52 and the additional dielectric layer 54.

Further, as shown in FIG. 6E, one or more second WFM layers 85 are formed over the first WFM layer 84. In some embodiments, the second WFM layer 85 is an n-type WFM material, such as TiAl, TiSiAl, TiAlC, TaAl or TaAlC. In some embodiments, the thickness of the second WFM layer is in a range from about 0.5 nm to about 6 nm and is in a range from about 2 nm to about 5 nm in other embodiments. In some embodiments, the thickness of the second WFM layer 85 at the bottom is the same as or up to three times the thickness at the side.

When the second WFM layer is made of TiAlC, the TiAlC layer is formed from source gases including $TiCl_4$ and organic aluminum (e.g., triethyaluminium). In some embodiments, the TiAlC layer contains Cl as an impurity. In some embodiments, the Al concentration in the TiAlC layer is in a range from about 5 atomic % to about 80 atomic %. When the Al concentration is too small, resistance of the TiAlC layer increases, and when the Al concentration is too high, Al diffusion may cause various problems (e.g., Vt shift). In some embodiments, a p-type FET includes both the p-type WFM material and the n-type WFM material as shown in FIG. 6E, and an n-type FET does not include the first WFM layer (p-type WFM material) 84. In some embodiments, similar to the operation explained with respect to FIG. 6D, an upper portion of the second WFM layer 85 is removed.

After the WFM layers are formed, a glue layer 86 as a blocking metal layer is formed over the WFM layers using one or more deposition and CMP operations, as shown in FIG. 6F. In some embodiments, the blocking metal layer 86 includes one or more of Ta, TaN, Ti, TiN or TiSiN. In certain embodiments, TiN is used. In other embodiments, WCN is used. In some embodiments, none of the layers 83, 84, 85 and 86 include a metal W layer containing more than 90 atomic % of W. In some embodiments, the thickness of the blocking metal layer 86 is in a range from about 3 nm to about 20 nm. As shown in FIG. 6F, the blocking metal layer 86 fully fills the gate space, while the gate dielectric layer 82, the barrier layer 83 and the WFM layers 84, 85 include a U-shape cross section (having a bottom and two vertical portions) in the Y direction (source-to-drain direction). In some embodiments, since the gate sidewall spacers 46 are recessed, the CMP is performed using the etching stop layer 52 and the additional dielectric layer 54, both made of silicon nitride, as a CMP stop layer. Therefore, no silicon oxide or silicon oxide based material are polished in the CMP operation.

Figure 7C:
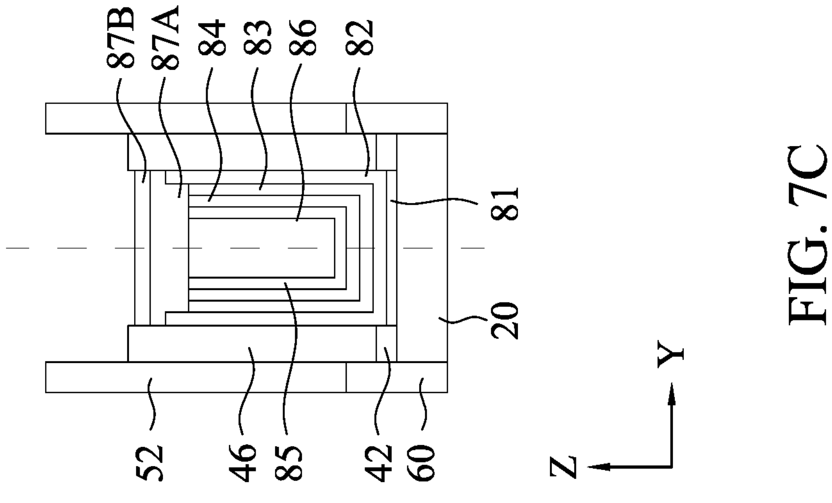
FIGS. 7A, 7B, and 7C show various stages of a sequential process for manufacturing a semiconductor device according to an embodiment of the present disclosure.
Figure 7B:
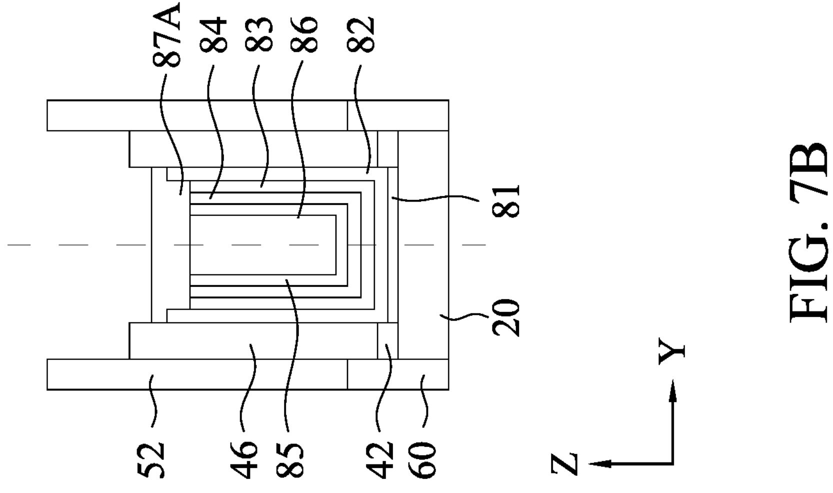
Figure 7A:
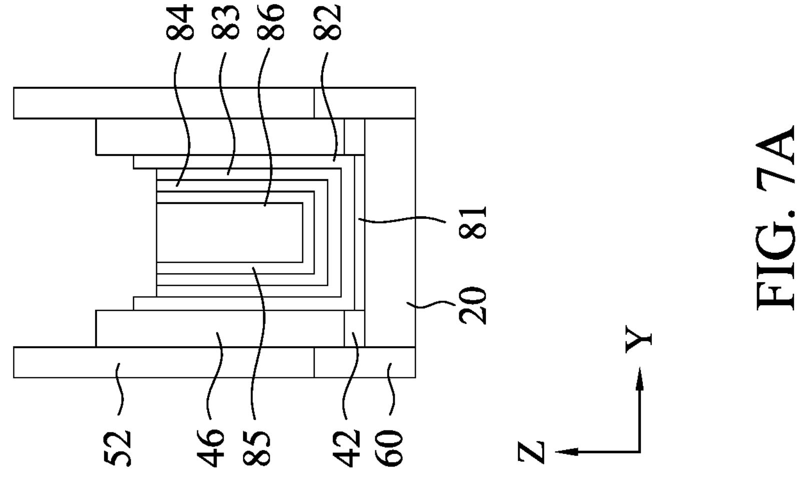

Then, as shown in FIG. 7A, an upper portion of the layers formed in the gate space is recessed by one or more etching operations. In some embodiments, in the etching operations, an upper part of the sidewall spacers 46 and/or an upper portion of the gate dielectric layer 82 are also etched.

Subsequently, as shown in FIG. 7B, a first cap metal layer 87A, which corresponds to one of the first, second and third conductive layers as described above, is formed over the recessed conductive layers by the processes as explained with respect to FIGS. 1A-3G.

In some embodiments, the first cap metal layer 87A includes W, Ta, Sn, Nb, Ru, Co or Mo. In some embodiments, the first cap metal layer 87A is formed by an ALD process using metal halide (chloride) gases (e.g., $TaCl_5$, $SnCl_4$, $NbCl_5$ or $MoCl_4$). In some embodiments, the first cap metal layer 87A includes a fluorine-free metal, for example, fluorine-free W formed by $WCl_5$ as a source gas. In some embodiments, the ALD process is a selective deposition process combined with an etching process such that the first cap metal layer 87 grows from metallic under-layers, such as, the barrier layer, the WFM layers and the blocking metal layer, and no metal layer is grown from the dielectric layers. Since the aspect ratio of the gate space 47 when the contact metal layer is formed is high (e.g., 1.25-7), the ALD process using metal halide gases effectively forms the first cap metal 87A without forming voids. Further, as a metal gate pitch shrinks, the width of the gate space 47 is not sufficient to form an extra (e.g., sacrificial) layer. By using a selective deposition directly on the WFM layer, it is possible to reduce damage to the metal gate structure. In other embodiments, the first cap metal layer 87 is formed by a sputtering process followed by the removal process as explained with respect to FIGS. 2A-3G.

In some embodiments, a second cap metal layer 87B similar to one of the first, second and third conductive layers is formed over the first cap metal layer 87A. In some embodiments, the top of the second cap metal layer 87B is equal to or lower than the top of the gate sidewall spacers 46. In other embodiments, the top of the second cap metal layer 87B is higher than the top of the gate sidewall spacers 46

(but lower than the top of the insulating layer 52) so that the second cap metal layer 87B covers the top of the gate sidewall spacers 46.

Figure 8C:
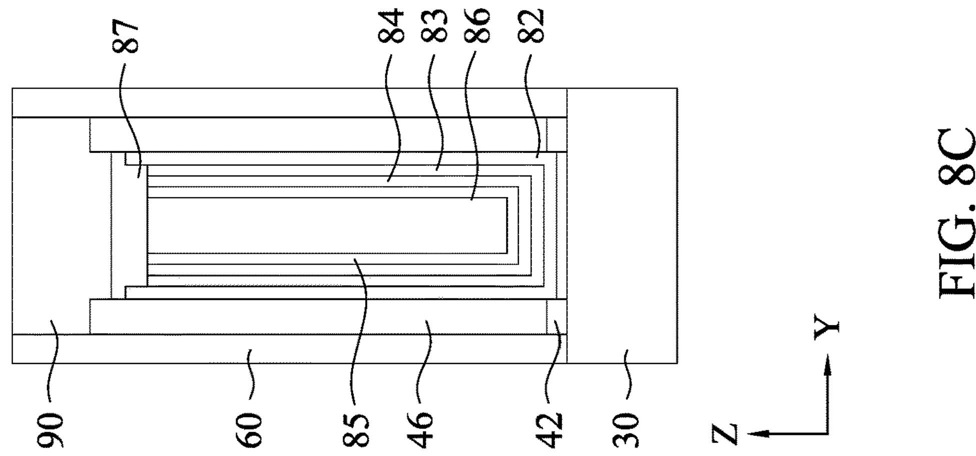
FIGS. 8A, 8B and 8C show various stages of a sequential process for manufacturing a semiconductor device according to an embodiment of the present disclosure.
Figure 8B:
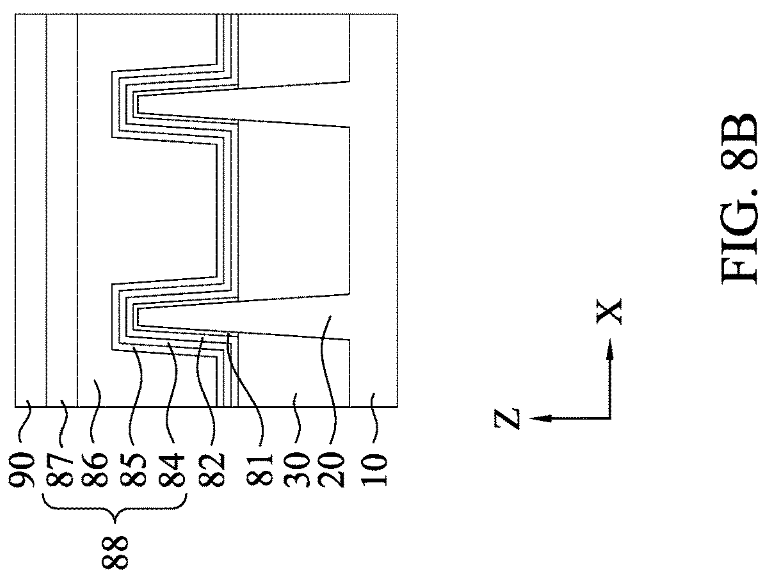
Figure 8A:
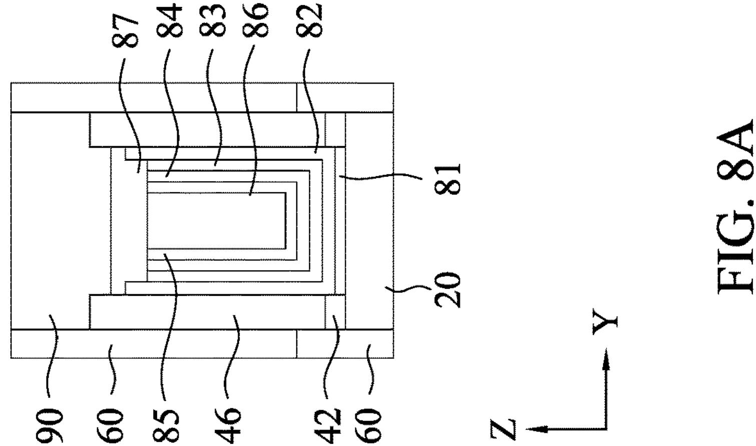

Further, as shown in FIGS. 8A, 8B and 8C, a gate cap insulating layer 90 is formed over the first (or the second) cap metal layer 87. In some embodiments, the gate cap insulating layer 90 includes silicon nitride, SiON and/or SiOCN or any other suitable material. FIG. 8B shows a cross sectional view corresponding to the X1-X1 line of FIG. 5D, and FIG. 8C shows a cross sectional view over the isolation insulating layer corresponding to the Y2-Y2 line of FIG. 5D. In FIG. 8B, a barrier layer is omitted. As shown in FIG. 8A, the conductive layers 84, 85, 86 and 87 (and optionally 83) may be collectively referred to a metal gate electrode 88. In some embodiments, in an n-type FET, the first WFM layer (p-type material layer) is not formed.

FIGS. 9A to 16B show various stages of manufacturing a metal gate structure of a GAA FET device using nanowires or nanosheets according to an embodiment of the present disclosure. It is understood that additional operations can be provided before, during, and after processes shown by FIGS. 9A-16B, and some of the operations described below can be replaced or eliminated, for additional embodiments of the method. The order of the operations/processes may be interchangeable.

Figure 9B:
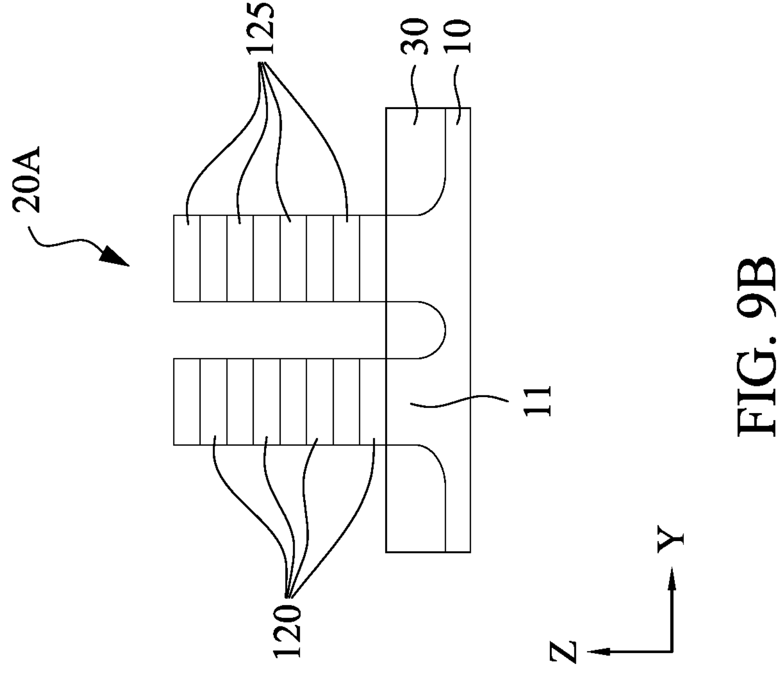
FIGS. 9A and 9B show various stages of a sequential process for manufacturing a semiconductor device according to an embodiment of the present disclosure.
Figure 9A:
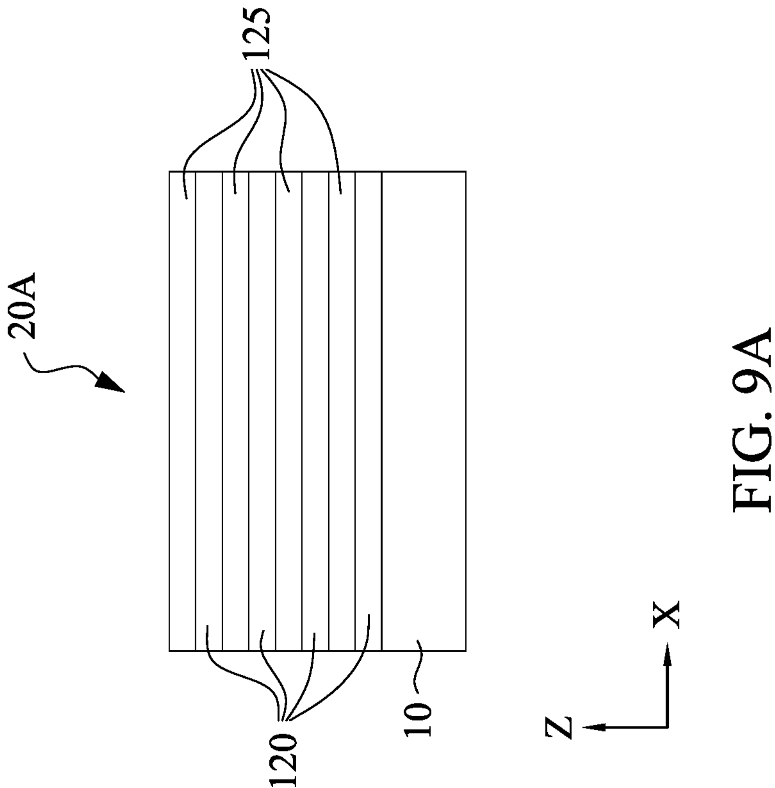

As shown in FIG. 9A, one or more fin structures 20A including first semiconductor layers 120 and second semiconductor layers 125 alternately formed over a bottom fin structure 11 disposed on the substrate 10 are formed. The first semiconductor layers 120 and the second semiconductor layers 125 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 120 and the second semiconductor layers 125 are made of Si, a Si compound, SiGe, Ge or a Ge compound. In some embodiments, the first semiconductor layers 120 are $Si_{1-x}Ge_x$, where x is equal to or more than about 0.1 and equal to or less than about 0.6, and the second semiconductor layers 125 are Si or $Si_{1-y}Ge_y$, where y is smaller than x and equal to or less than about 0.2. In this disclosure, an “M” compound” or an “M based compound” means the majority of the compound is M.

The first semiconductor layers 120 and the second semiconductor layers 125 are epitaxially formed over the substrate 10. The thickness of the first semiconductor layers 120 may be equal to or greater than that of the second semiconductor layers 125, and is in a range from about 5 nm to about 60 nm in some embodiments, and is in a range from about 10 nm to about 30 nm in other embodiments. The thickness of the second semiconductor layers 125 is in a range from about 5 nm to about 60 nm in some embodiments, and is in a range from about 10 nm to about 30 nm in other embodiments. The thickness of the first semiconductor layers 120 may be the same as, or different from the thickness of the second semiconductor layers 125. Although four first semiconductor layers 120 and four second semiconductor layers 125 are shown in FIGS. 9A and 9B, the numbers are not limited to four, and can be 1, 2, 3 or more than 4, and is less than 20. In some embodiments, the number of the first semiconductor layers 120 is greater by one than the number of the second semiconductor layers 125 (i.e.—the top layer is the first semiconductor layer).

After the stacked semiconductor layers are formed, fin structures 20A are formed by using one or more lithography and etching operations, as shown in FIGS. 9A and 9B. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIGS. 9A and 9B, the fin structures 20A extend in the X direction and are arranged in the Y direction. The number of the fin structures 20A is not limited to two, and may be as small as one and three or more. In some embodiments, one or more dummy fin structures are formed on both sides of the fin structures 20A to improve pattern fidelity in the patterning operations. The fin structures 20A have upper portions constituted by the stacked semiconductor layers. The width of the upper portion of the fin structure 20A along the Y direction is in a range from about 10 nm to about 40 nm in some embodiments, and is in a range from about 20 nm to about 30 nm in other embodiments.

After the fin structures 20A are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 125 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 9B, the insulating material layer is recessed to form an isolation insulating layer 30 so that the upper portions of the fin structures 20A are exposed. With this operation, the fin structures 20A are separated from each other by the isolation insulating layer 30, which is also called a shallow trench isolation (STI). The isolation insulating layer 30 may be made of suitable dielectric materials, such as silicon oxide, silicon nitride, silicon oxynitride, fluorine-doped silicate glass (FSG); low-k dielectrics, such as carbon doped oxides; extremely low-k dielectrics, such as porous carbon doped silicon dioxide; a polymer, such as a polyimide; combinations of these; or the like. In some embodiments, the isolation insulating layer 30 is formed through a process such as CVD, flowable CVD (FCVD), or a spin-on-glass process, although any acceptable process may be utilized.

Figure 10B:
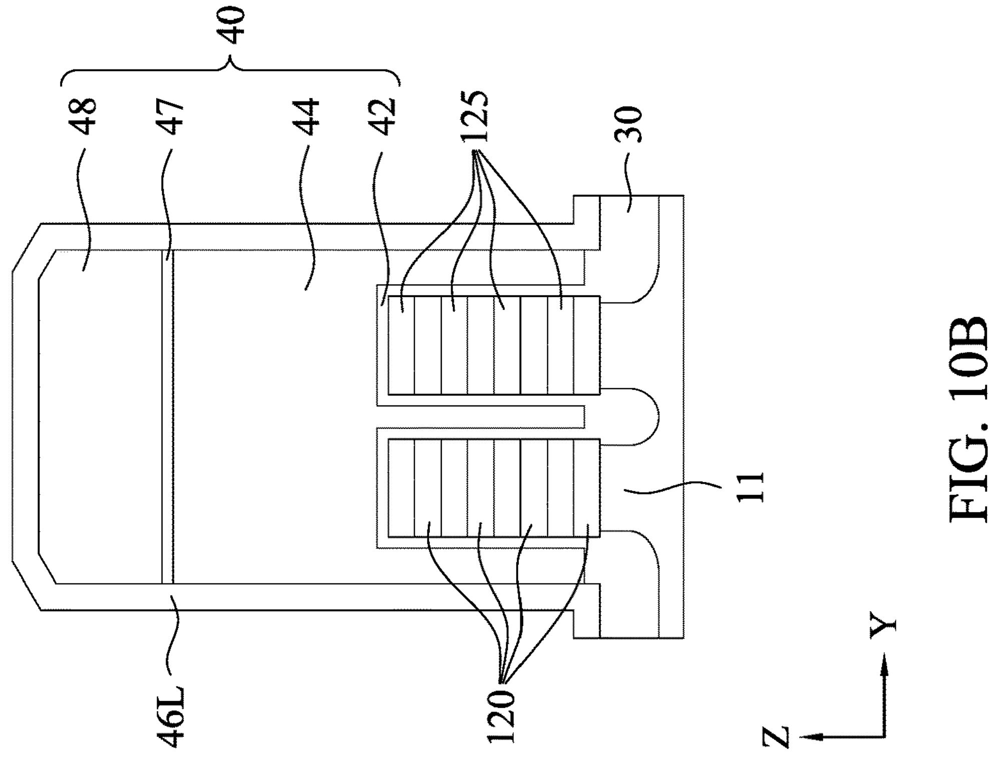
FIGS. 10A and 10B show various stages of a sequential process for manufacturing a semiconductor device according to an embodiment of the present disclosure.
Figure 10A:
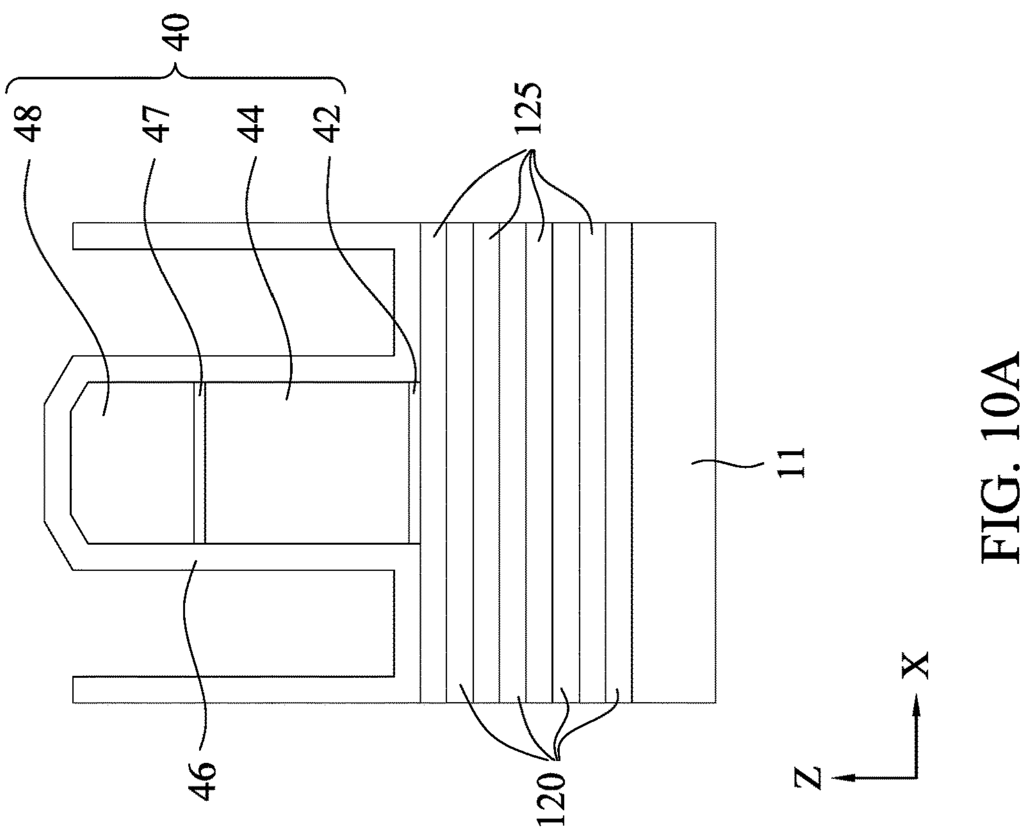

After the isolation insulating layer 30 is formed, a sacrificial (dummy) gate structure 40 is formed, as shown in FIGS. 10A and 10B. FIGS. 10A and 10B illustrate a structure after a sacrificial gate structure 40 is formed over the exposed fin structures. The sacrificial gate structure 40 is formed over a portion of the fin structures which is to be a channel region. The sacrificial gate structure 40 defines the channel region of the GAA FET. The sacrificial gate structure 40 includes a sacrificial gate dielectric layer 42 and a sacrificial gate electrode layer 44. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 47 and a silicon oxide mask layer 48.

Next, a patterning operation is performed on the mask layer and sacrificial gate electrode layer is patterned into the sacrificial gate structure 40, as shown in FIGS. 10A and 10B. The sacrificial gate structure includes the sacrificial gate dielectric layer 42, the sacrificial gate electrode layer 44 (e.g., poly silicon), the pad silicon nitride layer 47 and the silicon oxide mask layer 48. By patterning the sacrificial gate structure, the stacked layers of the first and second semiconductor layers are partially exposed on opposite sides of the sacrificial gate structure, thereby defining source/drain regions, as shown in FIGS. 10A and 10B. In this disclosure, a source and a drain are interchangeably used and the structures thereof are substantially the same. In FIGS. 10A and 10B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 46L for sidewall spacers is formed over the sacrificial gate structure 40, as shown in FIGS. 10A and 10B. The first cover layer 46L is deposited in a conformal manner so that it is formed to have substantially equal thicknesses on vertical surfaces, such as the sidewalls, horizontal surfaces, and the top of the sacrificial gate structure, respectively. In some embodiments, the first cover layer 46L has a thickness in a range from about 5 nm to about 20 nm. The first cover layer 46L includes one or more of silicon nitride, SiON, SiCN, SiCO, SiOCN or any other suitable dielectric material. The cover layer 46L can be formed by ALD or CVD, or any other suitable method. Then, the first cover layer 46L is anisotropicaly etched to remove the first cover layer 46L disposed on the source/drain region, while leaving the first cover layer as sidewall spacers 46 (see, FIG. 11A) on side faces of the sacrificial gate structure 40.

Figure 11B:
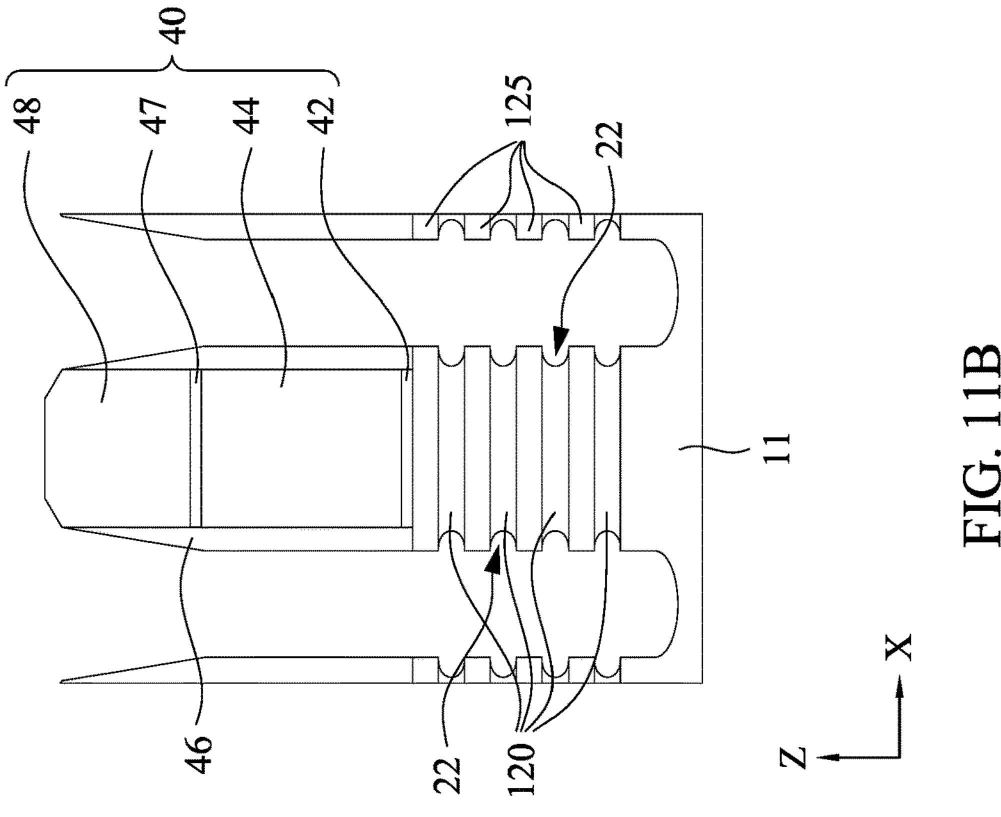
FIGS. 11A and 11B show various stages of a sequential process for manufacturing a semiconductor device according to an embodiment of the present disclosure.
Figure 11A:
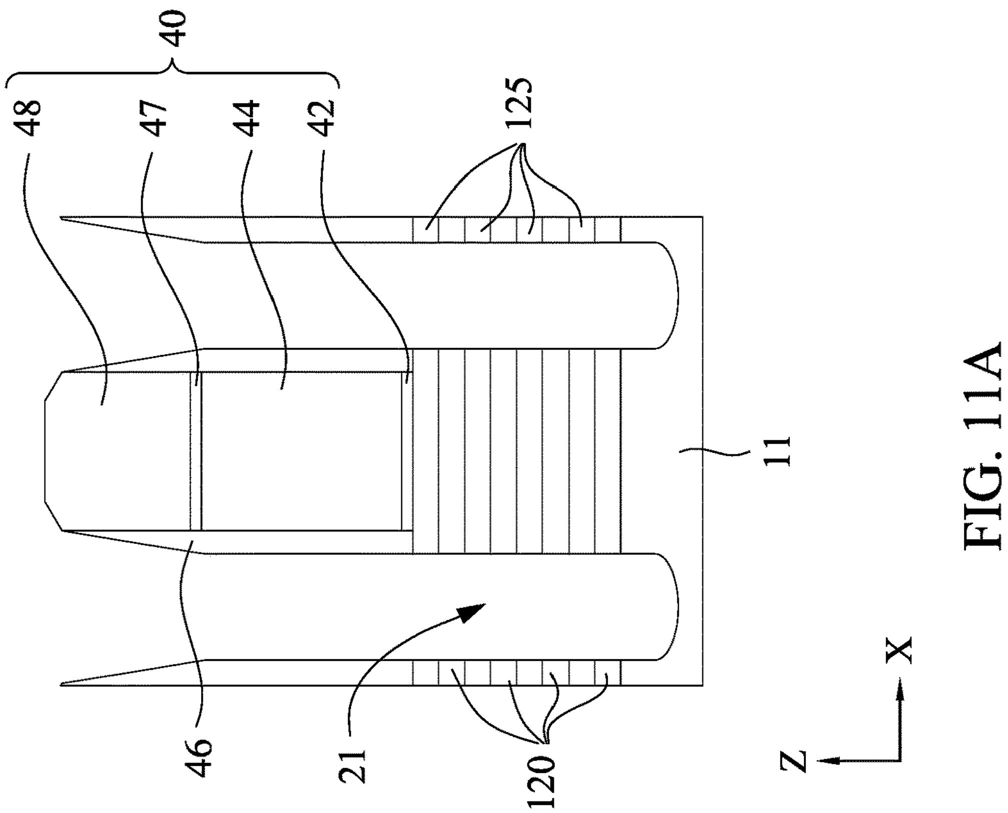

Then the stacked structure of the first semiconductor layers 120 and the second semiconductor layer 125 is etched down at the source/drain region, by using one or more lithography and etching operations, thereby forming a source/drain space 21, as shown in FIG. 11A. In some embodiments, the substrate 10 (or the bottom part of the fin structures 11) is also partially etched. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIG. 11A, the recessed fin structure has a U-shape. In other embodiments, the recessed fin structure has a V-shape showing (111) facets of silicon crystal. In other embodiments, the recess has a reverse trapezoid shape, or a rectangular shape. In some embodiments, the recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. The plasma is a remote plasma that is generated in a separate plasma generation chamber connected to the processing chamber in some embodiments.

Further, as shown in FIG. 11B, the first semiconductor layers 120 are laterally etched in the X direction within the source/drain space 21, thereby forming cavities 22. When the first semiconductor layers 120 are SiGe and the second semiconductor layers 125 are Si, the first semiconductor layers 120 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 12B:
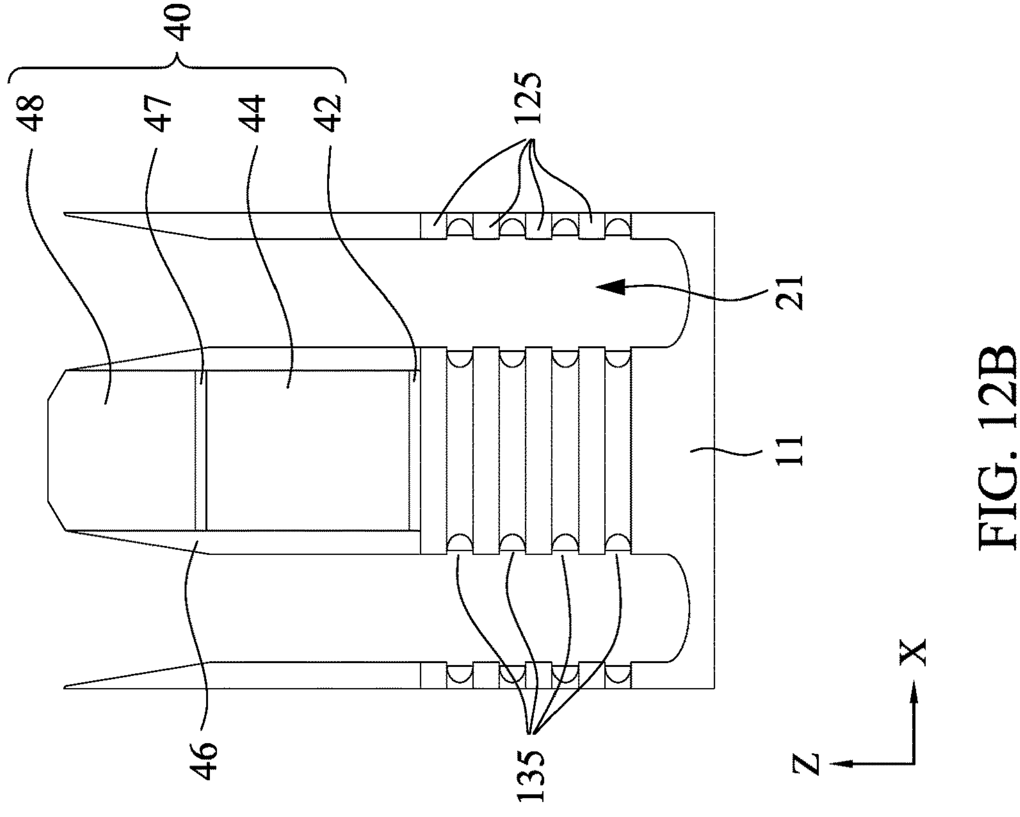
FIGS. 12A and 12B show various stages of a sequential process for manufacturing a semiconductor device according to an embodiment of the present disclosure.
Figure 12A:
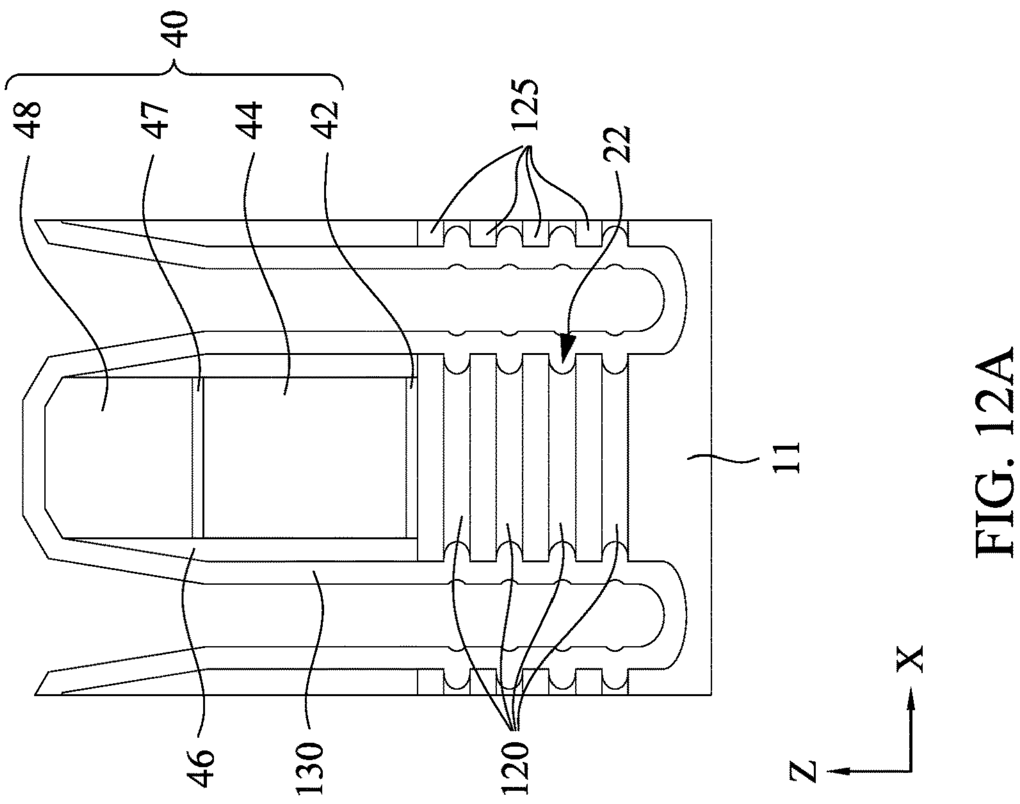

Next, as shown in FIG. 12A, a first insulating layer 130 is conformally formed on the etched lateral ends of the first semiconductor layers 120 and on end faces of the second semiconductor layers 125 in the source/drain space 21 and over the sacrificial gate structure 40. The first insulating layer 130 includes one of silicon nitride and silicon oxide, SiON, SiOC, SiCN and SiOCN, or any other suitable dielectric material. The first insulating layer 130 is made of a different material than the sidewall spacers (first cover layer) 46. The first insulating layer 30 has a thickness in a range from about 1.0 nm to about 10.0 nm in some embodiments. In other embodiments, the first insulating layer 130 has a thickness in a range from about 2.0 nm to about 5.0 nm. The first insulating layer 130 can be formed by ALD or any other suitable methods. By conformally forming the first insulating layer 130, the cavities 22 are fully filled with the first insulating layer 130.

After the first insulating layer 130 is formed, an etching operation is performed to partially remove the first insulating layer 130, thereby forming inner spacers 135, as shown in FIG. 12B. In some embodiments, the end face of the inner spacers 135 is recessed more than the end face of the second semiconductor layers 125. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 135 and the end face of the second semiconductor layers 125 are flush with each other).

Figure 13B:
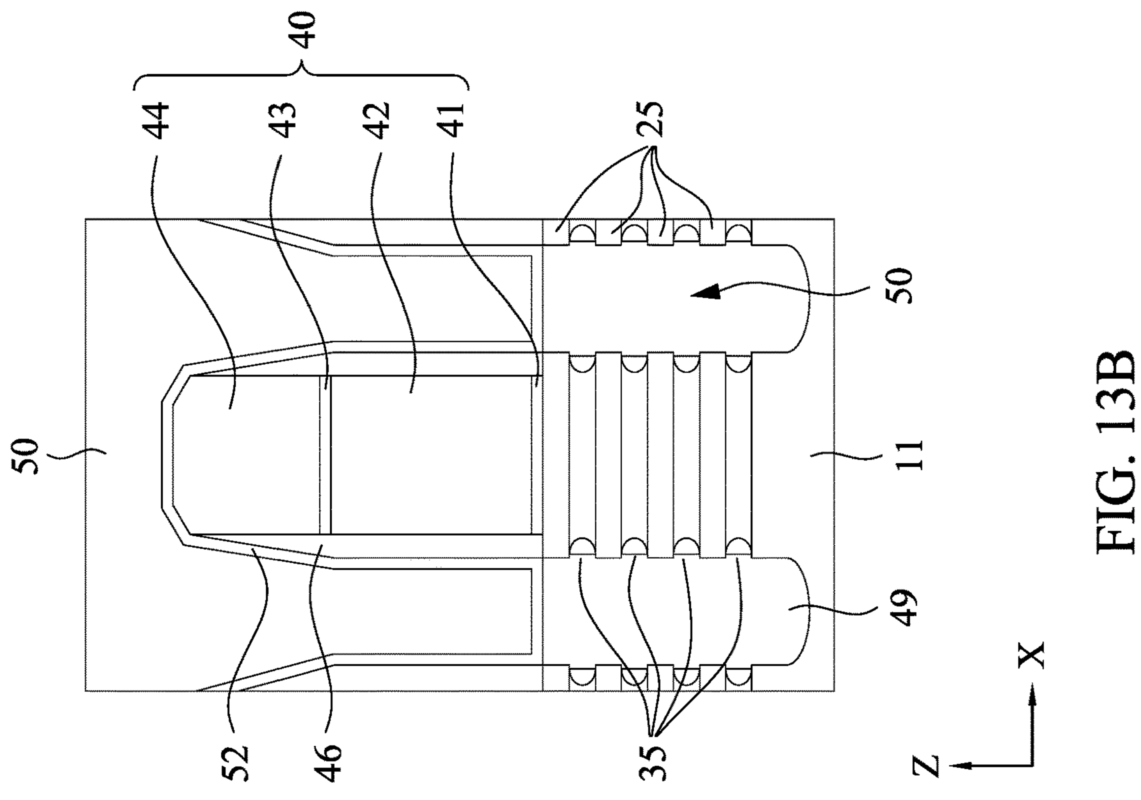
FIGS. 13A and 13B show various stages of a sequential process for manufacturing a semiconductor device according to an embodiment of the present disclosure.
Figure 13A:
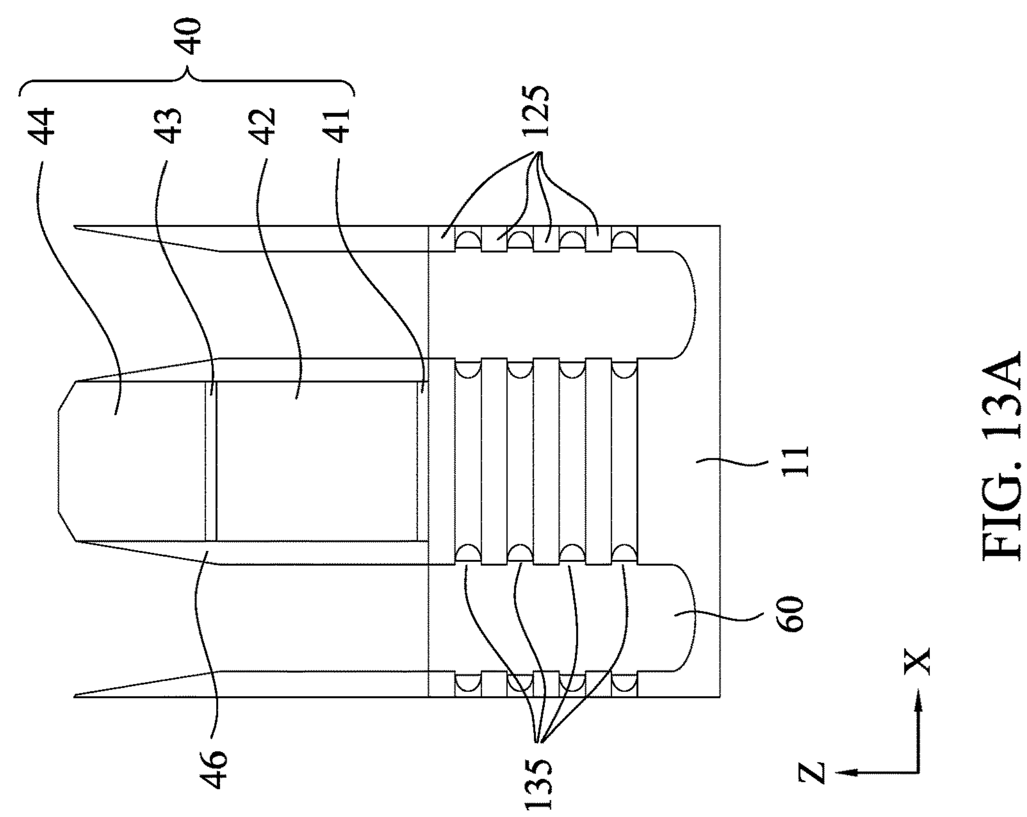

Subsequently, as shown in FIG. 13A, one or more source/drain epitaxial layers 60 are formed on the recessed fin structure 11 at the bottom of the source/drain space 21. In some embodiments, the source/drain epitaxial layer 60 includes a non-doped Si or non-doped SiGe, a doped Si, a doped SiGe or a doped Ge. In some embodiments, the dopant is C, P, As, B, and/or In.

Then, as shown in FIG. 13B, an etch stop layer 52 is formed. The etch stop layer 52 includes one of silicon nitride and silicon oxide, SiON, SiOC, SiCN and SiOCN, or any other suitable dielectric material. The etch stop layer 52 is made of a different material than the sidewall spacers (first cover layer) 46. The etch stop layer 52 can be formed by ALD or any other suitable methods. Next, a first interlayer dielectric (ILD) layer 50 is formed over the etch stop layer 52. The materials for the ILD layer 50 include compounds comprising Si, O, C and/or H, such as silicon oxide, SiCOH and SiOC. Organic materials, such as polymers, may be used for the ILD layer 50.

Figure 14B:
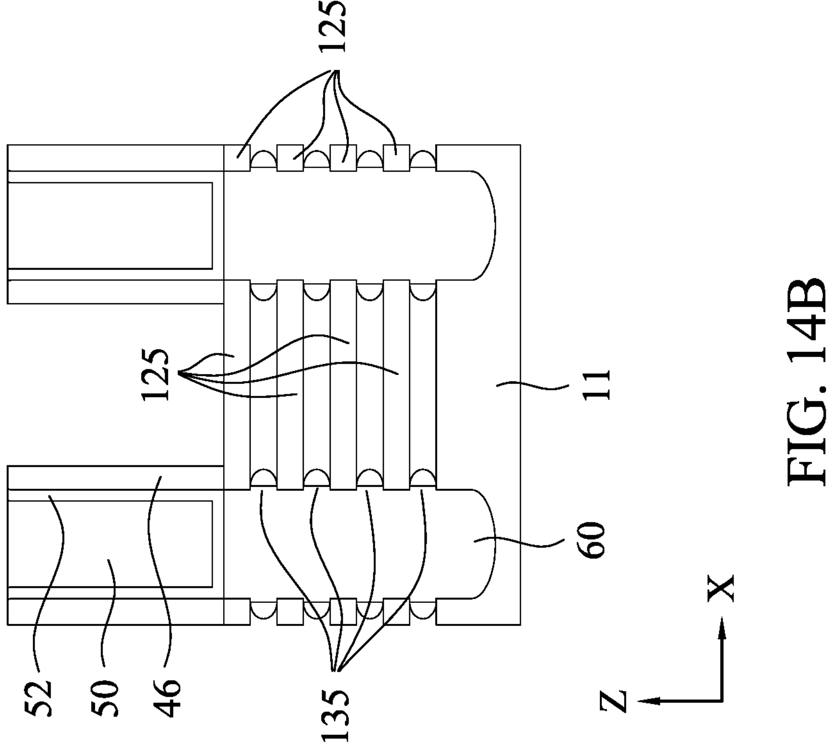
FIGS. 14A and 14B show various stages of a sequential process for manufacturing a semiconductor device according to an embodiment of the present disclosure.
Figure 14A:
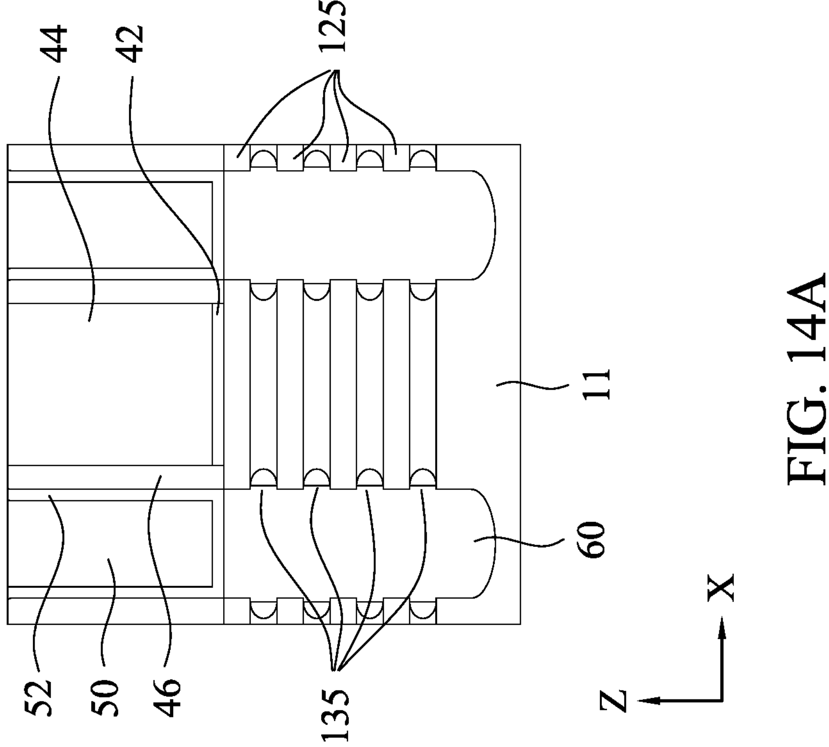

After the ILD layer 50 is formed, a planarization operation, such as CMP, is performed, so that the top portion of the sacrificial gate electrode layer 44 is exposed, as shown in FIG. 14A. Then, the sacrificial gate electrode layer 44 and sacrificial gate dielectric layer 42 are removed. The ILD layer 50 protects the source/drain epitaxial layers 60 during the removal of the sacrificial gate structures. The sacrificial gate structures can be removed using plasma dry etching and/or wet etching. When the sacrificial gate electrode layer 44 is polysilicon and the ILD layer 50 is silicon oxide, a wet etchant such as a TMAH solution can be used to selectively remove the sacrificial gate electrode layer 44. The sacrificial gate dielectric layer 42 is thereafter removed using plasma dry etching and/or wet etching.

After the sacrificial gate structures are removed, the first semiconductor layers 120 are removed, thereby forming wires or sheets (channel regions) of the second semiconductor layers 125, as shown in FIG. 14B. The first semiconductor layers 120 can be removed or etched using an etchant that can selectively etch the first semiconductor layers 120 against the second semiconductor layers 125, as set forth above. Since the first insulating layers (inner spacers) 135 are formed, the etching of the first semiconductor layers 120 stops at the first insulating layer 135. In other words, the first insulating layer 135 functions as an etch-stop layer for etching of the first semiconductor layers 120.

Figure 15B:
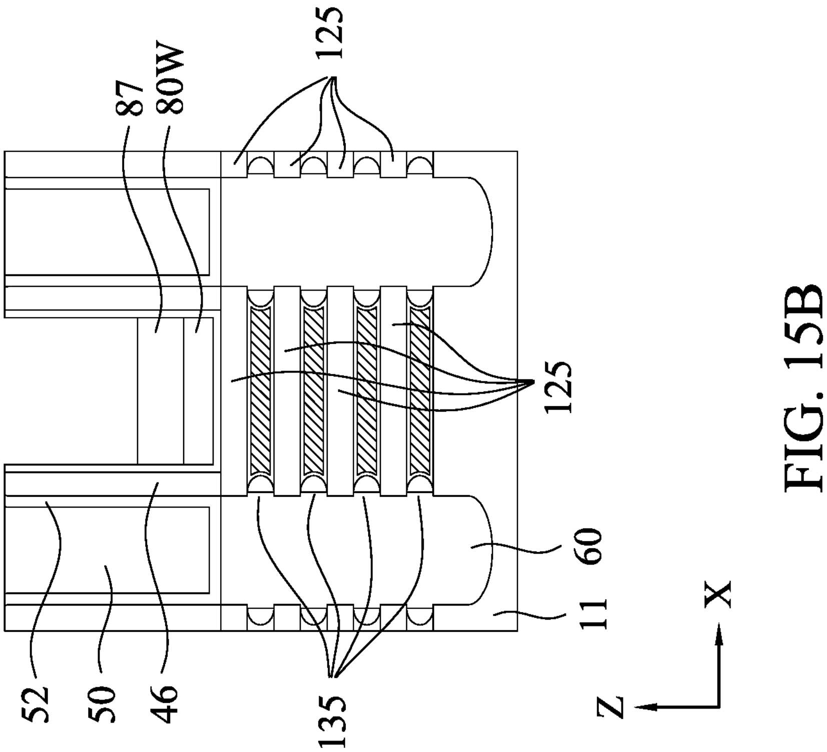
FIGS. 15A and 15B show various stages of a sequential process for manufacturing a semiconductor device according to an embodiment of the present disclosure.
Figure 15A:
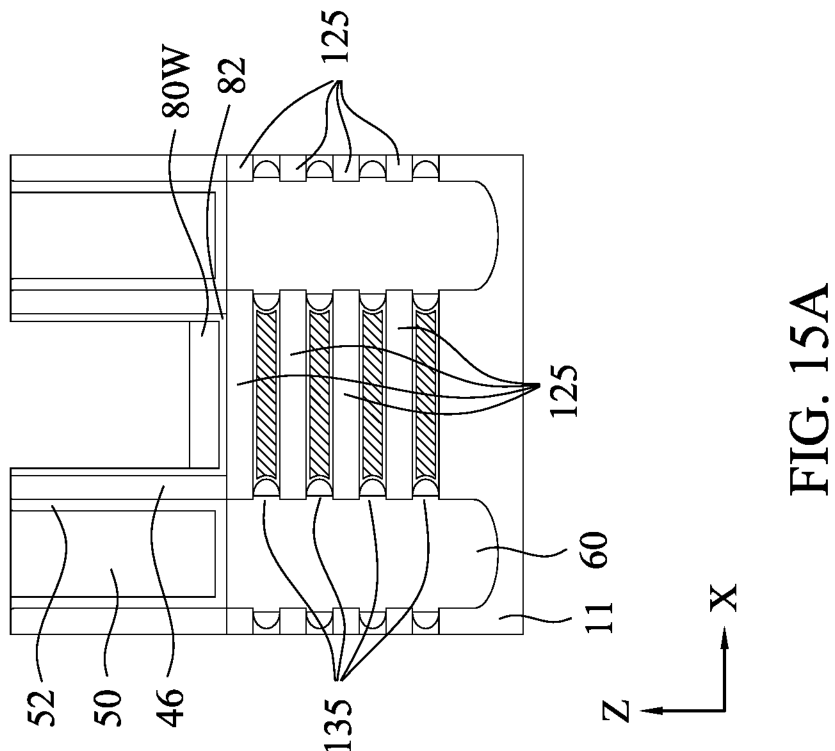

After the semiconductor wires or sheets (channel regions) of the second semiconductor layers 125 are formed, a gate dielectric layer 82 is formed around each of the channel regions, as shown in FIG. 15A. In some embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material. The gate dielectric layer 82 may be formed by CVD, ALD or any suitable method. In one embodiment, the gate dielectric layer 82 is formed using a highly conformal deposition process, such as ALD, in order to ensure the formation of a gate dielectric layer having a uniform thickness around each channel layers. The thickness of the gate dielectric layer 82 is in a range from about 1 nm to about 6 nm in one embodiment.

In some embodiments, one or more work function adjustment layers 80W are formed over the gate dielectric layer 82, as shown in FIG. 15A. The work function adjustment layers 80W are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Then, as shown in FIG. 15B, a cap metal layer 87 corresponding to one of the first, second and third conductive layers of FIGS. 1A-3G is formed as described above. The cap metal layer 87 includes W, Ta, Sn, Nb, Ru, Co or Mo. In some embodiments, the cap metal layer 87 is formed by an ALD process using metal halide (chloride) gases (e.g., $TaCl_5$, $SnCl_4$, $NbCl_5$ or $MoCl_4$). In some embodiments, the cap metal layer 87 includes a fluorine-free metal, for example, fluorine-free W formed by $WCl_5$ as a source gas. In some embodiments, a second cap metal layer similar to one of the first, second and third conductive layers is formed over the cap metal layer 87.

Figure 16B:
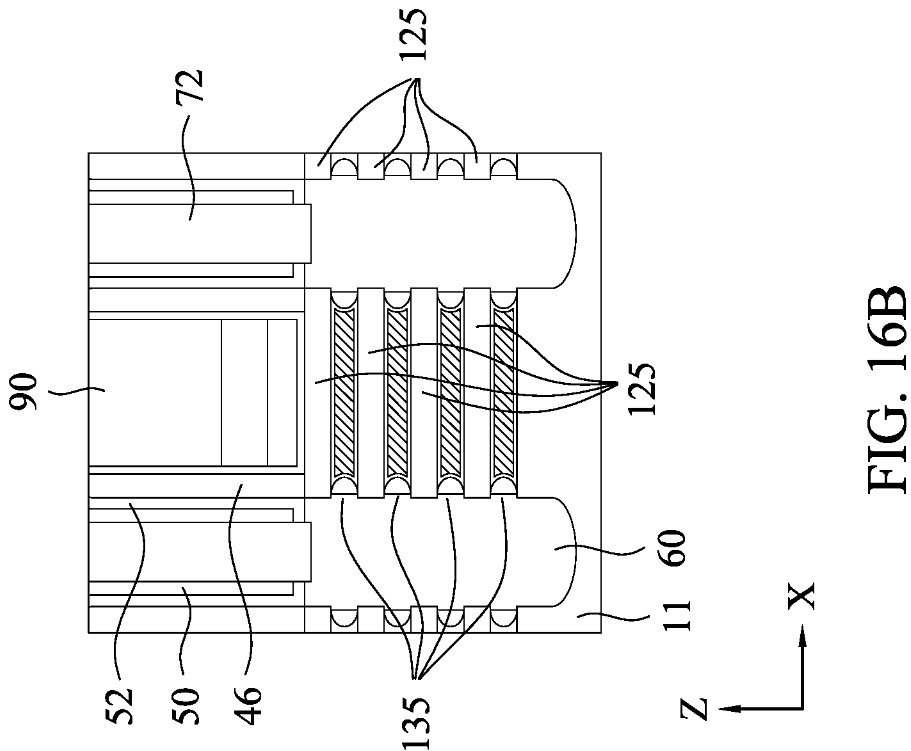
FIGS. 16A and 16B show various stages of a sequential process for manufacturing a semiconductor device according to an embodiment of the present disclosure.
Figure 16A:
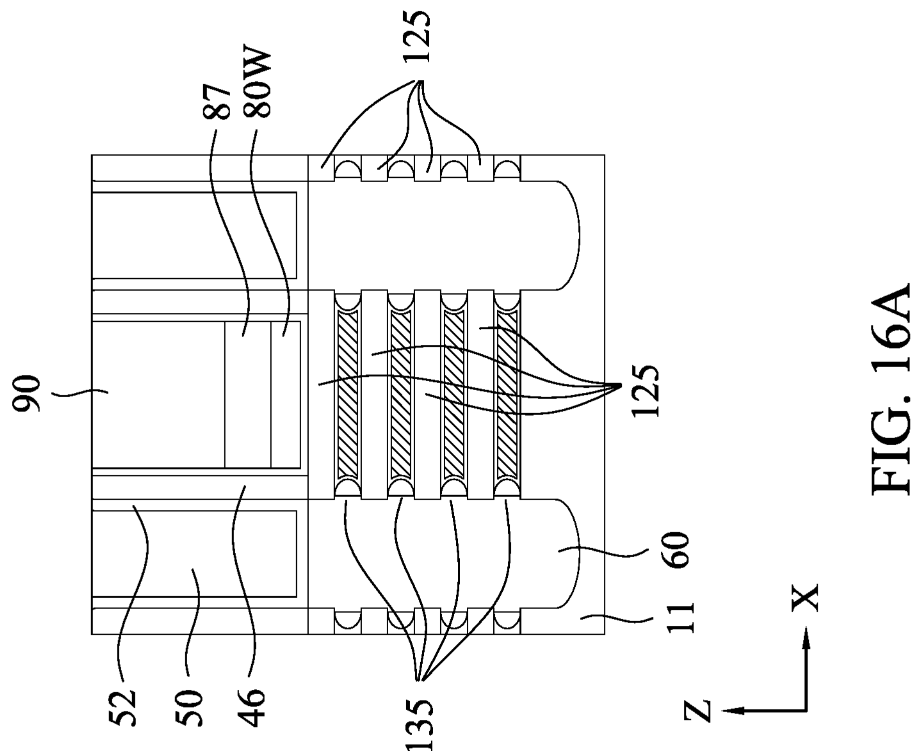

Further, as shown in FIG. 16A, a gate cap insulating layer 90 is formed over the cap metal layer 87. In some embodiments, the gate cap insulating layer 90 includes silicon nitride, SiON and/or SiOCN or any other suitable material.

Subsequently, contact holes are formed in the ILD layer 50 and the etch stop layer 52 by using dry etching, thereby exposing the upper portion of the source/drain epitaxial layer 60. In some embodiments, a silicide layer is formed over the source/drain epitaxial layer 60. The silicide layer includes one or more of WSi, CoSi, NiSi, TiSi, MoSi and TaSi. Then, a conductive contact layer 72 is formed in the contact holes as shown in FIG. 16B. The conductive contact layer 72 includes one or more of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

FIGS. 17A-17H show various stages of a damascene process for an FET device according to an embodiment of the present disclosure. It is understood that additional operations can be provided before, during, and after processes shown by FIGS. 17A-17H, and some of the operations described below can be replaced or eliminated, for additional embodiments of the method. The order of the operations/processes may be interchangeable.

Figures 17A, 17B, 17C, 17D, 17E, 17F, 17G, 17H:
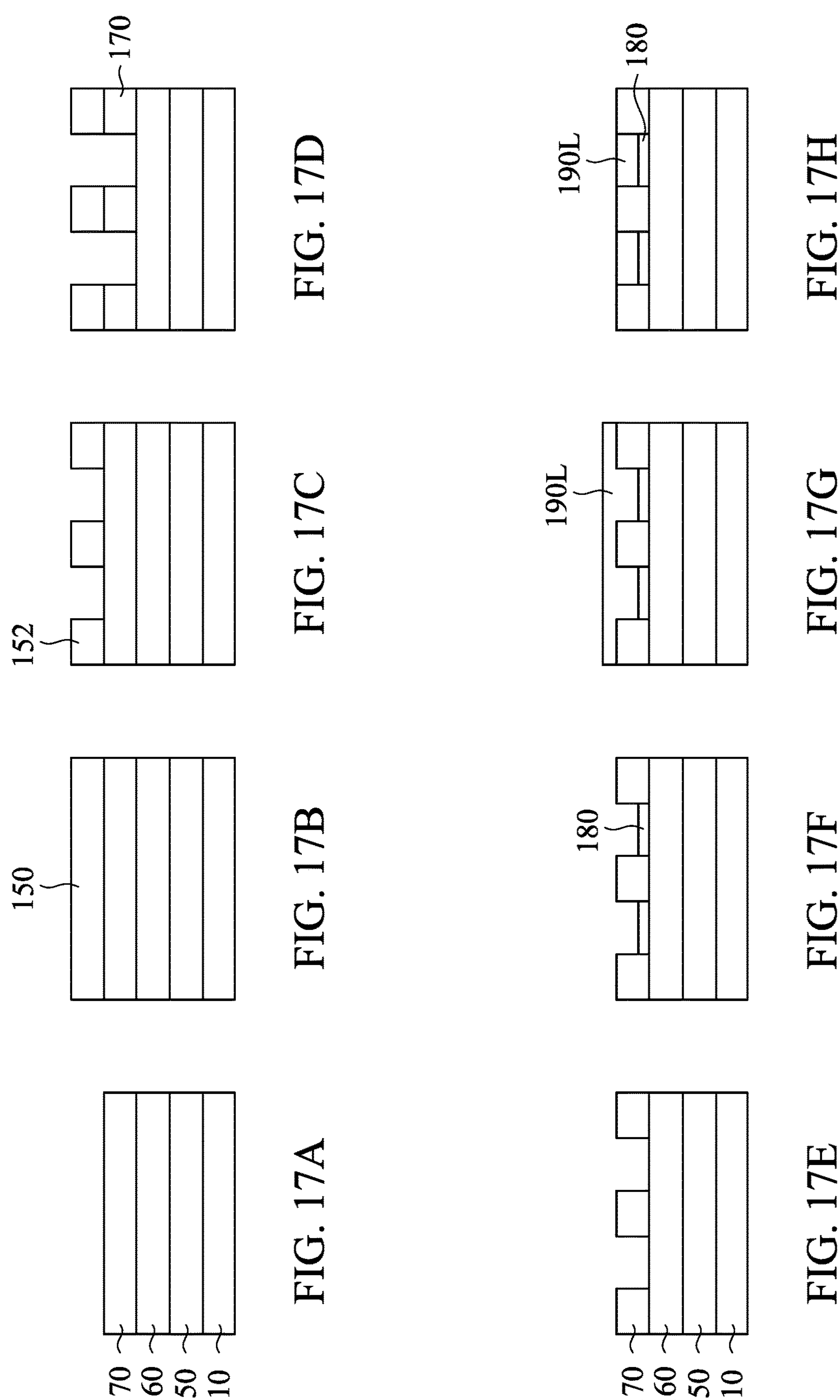
FIGS. 17A, 17B, 17C, 17D, 17E, 17F, 17G and 17H show various stages of a damascene process for an FET device according to an embodiment of the present disclosure.

The process shown by FIGS. 17A-17H is substantially the same as a single damascene process. As shown in FIG. 17A, a first ILD layer 50 is formed over the substrate 10, and a lower conductive layer 160 is formed over the first ILD layer 50. Further, a second ILD layer 170 is formed over the lower conductive layer 160. In some embodiments, the lower conductive layer 160 is a wiring pattern. Then, in some embodiments, a resist layer, for example, a photo resist layer 150 is formed over the second ILD layer 170 as shown in FIG. 17B, and then by using a lithography operation, the resist layer is patterned into a resist pattern 152 having holes or openings corresponding to the opening 49A as set forth above. Then, the second ILD layer 170 is patterned by using plasma etching to form holes in the second ILD layer 170 as shown in FIG. 17D. Then, the resist pattern 152 is removed as shown in FIG. 17E.

Then, one or more conductive layers 180, which correspond to one or more of the first, second and third conductive layer as set forth above, are formed in the holes. In some embodiments, the conductive layer 180 includes a barrier layer made of, for example, Ti, TiN, Ta and/or TaN. The conductive layer 180 further includes a seed layer made of, for example, Cu or a Cu alloy, formed over the barrier layer. These layers are formed by one of the processes described with respect to FIGS. 1A-3G.

Then, a blanket layer 190L for a via contact is formed as shown in FIG. 17G, and one or more planarization operations, such as a CMP process, is performed to remove excess portions of the blanket conductive layer, thereby forming via contact 190 as shown in FIG. 17H. In some embodiments, the via contact 190 includes one or more of W, Ti, Ta, Co, Ni, Mo, Ru, Cu, Al or alloy thereof.

The various embodiments or examples described herein offer several advantages over the existing art. In the embodiments of the present disclosure, one or more cap conductive layers are selectively formed on the lower conductive layer in an opening formed by a dielectric layer without being formed on the upper surface and inner wall of the opening. Such a bottom-only deposition of conductive materials improves process flexibility and suppresses formation of void or seam in the conductive layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, an opening is formed over a lower conductive layer in a dielectric layer, a first conductive layer is formed over the lower conductive layer in the opening without forming the first conductive layer on at least an upper surface of the dielectric layer, a second conductive layer is formed over the first conductive layer in the opening without forming the second conductive layer on at least an upper surface of the dielectric layer, and an upper layer is formed over the second conductive layer in the opening. In one or more of the foregoing and following embodiments, the upper layer is separated from the first conductive layer by the second conductive layer. In one or more of the foregoing and following embodiments, the first conductive layer is formed by atomic layer deposition or chemical vapor deposition using a metal chloride as a precursor. In one or more of the foregoing and following embodiments, the first conductive layer contains chlorine in an amount of 1 ppm to 100 ppm and is free from fluorine. In one or more of the foregoing and following embodiments, the second conductive layer is formed by atomic layer deposition or chemical vapor deposition using a metal fluoride as a precursor. In one or more of the foregoing and following embodiments, the second conductive layer contains fluorine in an amount of 1 ppm to 100 ppm. In one or more of the foregoing and following embodiments, the first conductive layer is made of a same material as the second conductive layer. In one or more of the foregoing and following embodiments, the upper layer is made of an insulating material.

In accordance with another aspect of the present disclosure, in a method of manufacturing a semiconductor device, an opening is formed over a lower conductive layer in a dielectric layer, a blanket layer is formed over the lower conductive layer in the opening, on a sidewall of the opening and an upper surface of the dielectric layer, a part of the blanket layer formed on a sidewall of the opening and an upper surface of the dielectric layer is removed, thereby forming a first conductive layer on the lower conductive layer, a second conductive layer is formed over the first conductive layer in the opening without forming the second conductive layer on at least the upper surface of the dielectric layer, and an upper layer is formed over the second conductive layer in the opening. In one or more of the foregoing and following embodiments, the part of the blanket layer formed on the sidewall of the opening and the upper surface of the dielectric layer is removed as follows. A first part of the blanket layer formed on the sidewall of the opening is removed, a protection layer is formed in the opening and over a second part of the blanket layer formed on the upper surface of the dielectric layer, the protection layer is recessed such that the second part of the blanket layer is exposed while a third part of the blanket layer formed on the lower conductive layer is covered by the protective layer, the second part of the blanket layer is removed, and the protection layer covering the third part of the blanket layer is removed. In one or more of the foregoing and following embodiments, the first part is removed by using a directional etching process. In one or more of the foregoing and following embodiments, the first part is removed by a wet etching process. In one or more of the foregoing and following embodiments, the second conductive layer is formed by atomic layer deposition or chemical vapor deposition using a metal chloride as a precursor. In one or more of the foregoing and following embodiments, the second conductive layer is formed by atomic layer deposition or chemical vapor deposition using a metal fluoride as a precursor. In one or more of the foregoing and following embodiments, a third conductive layer is formed between the lower conductive layer and the first conductive layer without forming the third conductive layer on at least the upper surface of the dielectric layer. In one or more of the foregoing and following embodiments, the third conductive layer is formed by atomic layer deposition or chemical vapor deposition using a metal chloride as a precursor.

In accordance with another aspect of the present disclosure, in a method of manufacturing a semiconductor device, a gate space is formed in a dielectric layer by removing a sacrificial gate electrode, a gate dielectric layer is formed in the gate space, conductive layers are formed on the gate dielectric layer to fully fill the gate space, the gate dielectric layer and the conductive layers are recessed to form recessed conductive layers, a first cap metal layer is formed on the recessed conductive layers in the gate space without forming the first cap metal layer on an upper surface of the dielectric layer, and a cap insulating layer is formed over the first cap metal layer in the gate space. The cap insulating layer is separated from the recessed conductive layers by the first cap metal layer. In one or more of the foregoing and following embodiments, at least one of the conductive layers has a U-shape cross section, and the first cap metal layer does not have a U-shape cross section. In one or more of the foregoing and following embodiments, at least one of the conductive layers does not have a U-shape cross section and includes TiN or WCN. In one or more of the foregoing and following embodiments, the first cap metal layer is formed by an atomic layer deposition using a metal penta-chloride as a source gas. In one or more of the foregoing and following embodiments, before the cap insulating layer is formed, a second cap metal layer is formed on the first cap metal layer in the gate space without forming the second cap metal layer on the upper surface of the dielectric layer.

In accordance with another aspect of the present disclosure, in a method of manufacturing a semiconductor device, a fin structure protruding from an isolation insulating layer disposed over a substrate is formed, a sacrificial gate dielectric layer is formed over the fin structure, a sacrificial gate electrode layer is formed over the sacrificial gate dielectric layer, gate sidewall spacers are formed, one or more dielectric layers are formed, a gate space is formed by removing the sacrificial gate electrode layer and the sacrificial gate dielectric layer, after the gate space is formed, the gate sidewall spacers are recessed, a gate dielectric layer is formed in the gate space, conductive layers are formed on the gate dielectric layer to fully fill the gate space, the gate dielectric layer and the conductive layers are recessed to form recessed conductive layers, a first cap metal layer is formed on the recessed conductive layers in the gate space without forming the first cap metal layer on an upper surface of the gate sidewall spacers and upper surfaces of the one or more dielectric layers, and a cap insulating layer is formed over the first cap metal layer in the gate space. The cap insulating layer is separated from the recessed conductive layers by the first cap metal layer. In one or more of the foregoing and following embodiments, the one or more dielectric layer includes an etching stop layer conformally formed on side faces of the gate sidewall spacers and an interlayer dielectric (ILD) layer formed on the etching stop layer. In one or more of the foregoing and following embodiments, the ILD layer includes a silicon oxide layer and a silicon nitride layer, both of which are in contact with the etching stop layer. In one or more of the foregoing and following embodiments, the etching stop layer includes silicon nitride. In one or more of the foregoing and following embodiments, the gate dielectric layer is formed on a top of the recessed gate sidewall spacers and in contact with the etching stop layer. In one or more of the foregoing and following embodiments, the first cap metal layer is one of W, Ta, Sn, Nb or Mo formed by a deposition method using a metal chloride gas. In one or more of the foregoing and following embodiments, before the cap insulating layer is formed, a second cap metal layer is formed on the first cap metal layer in the gate space without forming the second cap metal layer on the upper surface of the gate sidewall spacers and the upper surfaces of the one or more dielectric layers. In one or more of the foregoing and following embodiments, the first cap metal layer includes a lower amount of fluorine than the second cap metal layers or is free from fluorine.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a gate space in a dielectric layer by removing a sacrificial gate electrode;

forming a gate dielectric layer in the gate space;

forming at least three conductive layers on the gate dielectric layer to fully fill the gate space;

recessing the gate dielectric layer and the at least three conductive layers to form recessed conductive layers, wherein the at least three conductive layers are recessed to a substantially same height;

forming a first cap metal layer on the recessed conductive layers in the gate space without forming the first cap metal layer on an upper surface of the dielectric layer; and forming a cap insulating layer over the first cap metal layer in the gate space, wherein the cap insulating layer is separated from the recessed conductive layers by the first cap metal layer.

2. The method of claim 1, wherein:

at least one of the conductive layers has a U-shape cross section, and the first cap metal layer does not have a U-shape cross section.

3. The method of claim 1, wherein at least one of the conductive layers does not have a U-shape cross section and includes TiN or WCN.

4. The method of claim 1, wherein the first cap metal layer is formed by an atomic layer deposition using a metal penta-chloride as a source gas.

5. The method of claim 4, further comprising, before the cap insulating layer is formed, forming a second cap metal layer on the first cap metal layer in the gate space without forming the second cap metal layer on the upper surface of the dielectric layer.

6. The method of claim 5, wherein gate sidewall spacers are disposed on opposing sidewalls of the conductive layers as seen in cross section.

7. The method of claim 6, wherein the second cap metal layer covers tops of the gate sidewall spacers.

8. The method of claim 1, wherein the gate cap insulating layer includes one or more of silicon nitride, SiON, and SiOCN.

9. The method of claim 1, wherein forming the at least three conductive layers comprises:

forming a first conductive layer on the gate dielectric layer;

forming a second conductive layer on the first conductive layer; and forming a third conductive layer on the second conductive layer, wherein the first, second, and third conductive layers are made of different materials.

10. The method of claim 1, wherein one or more fin structures are disposed in the gate space.

11. A method of manufacturing a semiconductor device, comprising:

forming an opening in a dielectric layer by removing a sacrificial gate electrode;

forming a gate dielectric layer in the opening;

forming a barrier layer over the gate dielectric layer;

forming a work function adjustment material layer over the barrier layer;

forming a blocking metal layer over the work function adjustment material layer over to fully fill the opening;

recessing the gate dielectric layer, barrier layer, work function adjustment material layer, and the blocking metal layer to form a recess in the dielectric layer, wherein the barrier layer, work function adjustment material layer, and the blocking metal layer are recessed to a substantially same height;

forming a first cap metal layer in the recess without forming the first cap metal layer on an upper surface of the dielectric layer; and forming a cap insulating layer over the first cap metal layer in the recess, wherein the cap insulating layer is separated from the recessed gate dielectric layer, barrier layer, work function adjustment material layer, and blocking metal layer by the first cap metal layer.

12. The method of claim 11, wherein:

at least one of the barrier layer and the work function adjustment material layer has a U-shape cross section, and the first cap metal layer does not have a U-shape cross section.

13. The method of claim 11, wherein the blocking metal layer includes one or more of Ta, TaN, Ti, TiN, or TiSiN.

14. The method of claim 11, wherein the first cap metal layer is formed by an atomic layer deposition using a metal penta-chloride as a source gas.

15. The method of claim 11, further comprising, before the cap insulating layer is formed, forming a second cap metal layer on the first cap metal layer in the recess without forming the second cap metal layer on the upper surface of the dielectric layer.

16. A method of manufacturing a semiconductor device, comprising:

forming an opening in a dielectric layer by removing a sacrificial gate electrode;

forming a gate dielectric layer in the opening;

forming a first conductive layer over the gate dielectric layer;

forming a second conductive layer over the first conductive layer;

recessing the first conductive layer and the second conductive layer to expose a portion of the gate dielectric layer;

forming a third conductive layer over the recessed second conductive layer and the exposed portion of the gate dielectric layer;

forming a fourth conductive layer over the third conductive layer to fully fill the opening;

recessing the gate dielectric layer, the first conductive layer, the second conductive layer, the third conductive layer, and the fourth conductive layer to form a recess in the dielectric layer, wherein the first conductive layer, the second conductive layer, the third conductive layer, and the fourth conductive layer are recessed to a substantially same height;

forming a first cap metal layer in the recess without forming the first cap metal layer on an upper surface of the dielectric layer; and forming a cap insulating layer over the first cap metal layer in the recess, wherein the cap insulating layer is separated from the recessed gate dielectric layer, first conductive layer, second conductive layer, third conductive layer, and the fourth conductive layer by the first cap metal layer.

17. The method of claim 16, wherein:

at least one of the first conductive layer, the second conductive layer, and the third conductive layer has a U-shape cross section, and the first cap metal layer does not have a U-shape cross section.

18. The method of claim 16, wherein the fourth conductive layer includes one or more of Ta, TaN, Ti, TiN, or TiSiN.

19. The method of claim 16, wherein the first cap metal layer is formed by an atomic layer deposition using a metal penta-chloride as a source gas.

20. The method of claim 16, further comprising, before the cap insulating layer is formed, forming a second cap metal layer on the first cap metal layer in the recess without forming the second cap metal layer on the upper surface of the dielectric layer.

* * * * *